US012563672B2

(12) United States Patent
Liang

(10) Patent No.: US 12,563,672 B2
(45) Date of Patent: Feb. 24, 2026

(54) BOARD-LEVEL STRUCTURE AND COMMUNICATION DEVICE

(71) Applicant: HUAWEI TECHNOLOGIES CO., LTD., Shenzhen (CN)

(72) Inventor: Ying Liang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 264 days.

(21) Appl. No.: 18/343,783

(22) Filed: Jun. 29, 2023

(65) Prior Publication Data

US 2023/0345638 A1 Oct. 26, 2023

Related U.S. Application Data

(63) Continuation of application No. PCT/CN2021/142256, filed on Dec. 29, 2021.

(30) Foreign Application Priority Data

Dec. 31, 2020 (CN) .......................... 202011639632.4

(51) Int. Cl.
| | |
|---|---|
| *H05K 1/181* | (2026.01) |
| *H01L 23/00* | (2006.01) |
| *H01L 23/498* | (2006.01) |

(52) U.S. Cl.
CPC ....... *H05K 1/181* (2013.01); *H01L 23/49816* (2013.01); *H01L 23/562* (2013.01);
(Continued)

(58) Field of Classification Search
CPC .... H05K 1/14; H05K 1/141–147; H05K 1/18; H05K 1/181–187;
(Continued)

(56) References Cited

U.S. PATENT DOCUMENTS

| | | | |
|---|---|---|---|
| 6,824,041 B2 | 11/2004 | Grieder et al. | |
| 8,152,048 B2 * | 4/2012 | Zu ........................ | B23K 3/0638 |
| | | | 228/103 |

(Continued)

FOREIGN PATENT DOCUMENTS

| | | |
|---|---|---|
| CN | 1945802 A | 4/2007 |
| CN | 101752279 A | 6/2010 |

(Continued)

OTHER PUBLICATIONS

PCT International Search Report for PCT Application No. PCT/CN2021/142256 dated Dec. 29, 2021, 8 pages.
(Continued)

*Primary Examiner* — Tuan T Dinh

(57) ABSTRACT

The technology of this application relates to a board-level structure that includes an upper-layer substrate, a lower-layer substrate, and a plurality of support members that are supported between the upper-layer substrate and the lower-layer substrate. In an example embodiment, a gap exists between the upper-layer substrate and the lower-layer substrate, the gap includes at least one first gap region and at least one second gap region, the first gap region and the second gap region are spaced, a spaced region between the first gap region and the second gap region does not include the first gap region or the second gap region, and a maximum vertical distance between the upper-layer substrate and the lower-layer substrate in the first gap region is less than a minimum vertical distance between the upper-layer substrate and the lower-layer substrate in the second gap region.

20 Claims, 12 Drawing Sheets

100

(52) U.S. Cl.
  CPC .............. *H05K 2201/10015* (2013.01); *H05K 2201/10022* (2013.01); *H05K 2201/10378* (2013.01); *H05K 2201/10515* (2013.01); *H05K 2201/10734* (2013.01); *H05K 2201/10984* (2013.01)

(58) Field of Classification Search
  CPC .......... H05K 2201/10015; H05K 2201/10022; H05K 2201/10378; H05K 2201/10515; H05K 2201/10734; H01L 23/498; H01L 23/49811; H01L 23/49833; H01L 23/552; H01L 23/562
  USPC ......... 361/770–784, 790, 792–795; 257/686, 257/737, 772–782
  See application file for complete search history.

(56) References Cited

U.S. PATENT DOCUMENTS

| | | | |
|---|---|---|---|
| 8,531,821 | B2 | 9/2013 | Holzman et al. |
| 9,385,098 | B2 * | 7/2016 | Zhang ..................... H01L 24/14 |
| 9,543,284 | B2 * | 1/2017 | Yew .................. H01L 21/76877 |
| 2005/0109455 | A1 | 5/2005 | Bai |
| 2007/0092992 | A1 | 4/2007 | Theuss |
| 2007/0152350 | A1 * | 7/2007 | Kim ..................... H05K 3/3436 438/666 |
| 2011/0084375 | A1 * | 4/2011 | Eu .......................... H05K 1/141 257/E23.068 |
| 2011/0100692 | A1 * | 5/2011 | Topacio ............... H05K 3/3436 174/250 |
| 2011/0233771 | A1 * | 9/2011 | Kwon ............... H01L 23/49816 257/737 |
| 2014/0091456 | A1 | 4/2014 | Limaye et al. |
| 2014/0319682 | A1 | 10/2014 | Sidhu et al. |
| 2015/0022986 | A1 * | 1/2015 | Steuer ................... H05K 3/368 361/767 |

FOREIGN PATENT DOCUMENTS

| | | |
|---|---|---|
| CN | 107509319 A | 12/2017 |
| CN | 109195353 A | 1/2019 |
| CN | 109600917 A | 4/2019 |
| JP | H11111764 A | 4/1999 |
| JP | H11186454 A | 7/1999 |
| JP | 2000164758 A | 6/2000 |
| JP | 2001094002 A | 4/2001 |
| JP | 2012039045 A | 2/2012 |
| WO | 2015114771 A1 | 8/2015 |

OTHER PUBLICATIONS

European Search Report for EP Application No. 21914441.7 dated May 3, 2024, 10 pages.
Office Action for Chinese Application No. 202011639632 dated Aug. 30, 2024, 14 pages.

* cited by examiner

1000

100

100

100

100

100

100

100

31

312

313

314

31

313

314

BOARD-LEVEL STRUCTURE AND COMMUNICATION DEVICE

CROSS-REFERENCE TO RELATED APPLICATIONS

This application is a continuation of International Application No. PCT/CN2021/142256, filed on Dec. 29, 2021, which claims priority to Chinese Patent Application No. 202011639632.4, filed on Dec. 31, 2020. The disclosures of the aforementioned applications are hereby incorporated by reference in their entireties.

TECHNICAL FIELD

This application relates to the field of communication technologies, and in particular, to a board-level structure and a communication device.

BACKGROUND

With continuous evolution of a quantity of chip channels, computing power, and the like, a size of a chip package becomes increasingly large, and warping and deformation of a package substrate and a printed circuit board also become increasingly difficult to control. A quality risk of soldering the package substrate and the printed circuit board is greatly increased due to large deformation, which easily results in soldering problems such as solder bridging and open soldering, and a batch soldering yield is a great challenge. How to meet a board-level assembly requirement and soldering quality of the package substrate and the printed circuit board under large deformation is a subject of continuous exploration in the industry.

SUMMARY

Embodiments of this application provide a board-level structure and a communication device, to meet a board-level assembly requirement and soldering quality of a package substrate and a printed circuit board under large deformation.

According to a first aspect, this application provides a board-level structure, including an upper-layer substrate, a lower-layer substrate, and a plurality of support members that can be supported between the upper-layer substrate and the lower-layer substrate, where there is a gap between the upper-layer substrate and the lower-layer substrate, the gap includes one or more first gap regions and one or more second gap regions in a plane on which an orthographic projection of the upper-layer substrate is located, the first gap region and the second gap region are spaced, a spaced region between the first gap region and the second gap region does not include the first gap region or the second gap region, and a vertical distance between the upper-layer substrate and the lower-layer substrate in the first gap region is less than or equal to a vertical distance between the upper-layer substrate and the lower-layer substrate in the second gap region; and a maximum vertical distance between the upper-layer substrate and the lower-layer substrate in the first gap region is less than a minimum vertical distance between the upper-layer substrate and the lower-layer substrate in the second gap region, and a difference between the minimum vertical distance and the maximum vertical distance is greater than or equal to 100 micrometers; and the plurality of support members are distributed in the first gap region and/or the second gap region at intervals.

It may be understood that the first gap region is a relatively small gap region, and in the first gap region, a solder bridging defect may occur on two adjacent solder joints in a normal case. Therefore, the support member is arranged in the first gap region, so that a specific interval can be always maintained between the upper-layer substrate and the lower-layer substrate through a support function of the support member, to effectively minimize a possibility that solder bridging occurs on the two adjacent solder joints when a soldering material collapses because deformation of the upper-layer substrate and the lower-layer substrate increases with a change of a temperature in a process of heating and soldering the upper-layer substrate and the lower-layer substrate, thereby ensuring reliability of a circuit system of the board-level structure.

In addition, the second gap region is a relatively large gap region, and in the second gap region, the solder bridging defect is not likely to occur on two adjacent solder joints in a normal case. However, considering fluctuation between batches of soldering incoming materials and a dynamic change of a single material in a soldering process, a soldering problem of solder bridging may also be generated between the two adjacent solder joints in a specific case. Therefore, the support member is arranged in the second gap region, so that a possibility that such a soldering defect occurs can be minimized, and a good prevention effect is achieved.

Based on the foregoing description, it should be understood that both the first gap region and the second gap region may be considered as risk regions in which solder bridging occurs. The support member is added to the risk region, so that even if the soldering material collapses under the action of a weight of the upper-layer substrate and a surface tension of the soldering material, a soldering defect of solder bridging is not likely to occur in the first gap region and the second gap region due to a support capability of the support member and a support height of the support member, and electrical interconnection performance between the upper-layer substrate and the lower-layer substrate is excellent.

In a possible implementation, when a quantity of first gap regions is greater than or equal to 2, there is one second gap region between every two adjacent first gap regions.

In a possible implementation, the plurality of support members are distributed in the first gap region and the second gap region at intervals, and in the first gap region, the support members are supported between the upper-layer substrate and the lower-layer substrate; and in the second gap region, one end of two ends of the support member abuts against one of the upper-layer substrate and the lower-layer substrate, and the other end of the two ends of the support member is isolated from the other of the upper-layer substrate and the lower-layer substrate; or in the second gap region, two ends of the support member respectively abut against the upper-layer substrate and the lower-layer substrate.

It may be understood that, in the first gap region, the support member is supported between the upper-layer substrate and the lower-layer substrate. That is, the two ends of the support member in the first gap region respectively abut against the upper-layer substrate and the lower-layer substrate. In this way, the support member in the first gap region can support the upper-layer substrate and the lower-layer substrate, to minimize a possibility that a solder bridging defect is generated between two adjacent solder joints in the small gap region because the soldering material can only collapse horizontally due to an insufficient longitudinal interval between the upper-layer substrate and the lower-layer substrate (that is, the vertical distance between the upper-layer substrate and the lower-layer substrate), and consequently, the two adjacent solder joints are bridged together due to excessive collapse, and ensure that the solder bridging defect does not occur between the two adjacent solder joints because there is a proper interval between the upper-layer substrate and the lower-layer substrate, thereby helping reduce assembly difficulty between the upper-layer substrate and the lower-layer substrate.

In addition, the support member arranged in the second gap region may be in contact with both the dual-side substrates, to substantially support the upper-layer substrate and the lower-layer substrate, or may be in contact with only the one-side substrate without supporting the upper-layer substrate and the lower-layer substrate. That is, the support member arranged in the second gap region can prevent fluctuation between the batches of soldering incoming materials and a dynamic change of the single material in a soldering process, and is supported between the upper-layer substrate and the lower-layer substrate in a specific case, so that various possible changes in an assembly process of the upper-layer substrate and the lower-layer substrate can be flexibly responded to, practicality is strong, and an application range is wide.

In a possible implementation, a height of the support member in the first gap region is not equal to a height of the support member in the second gap region, and a height direction of the support member is a direction perpendicular to a plane on which a surface of the lower-layer substrate is located; or a height of the support member in the first gap region is equal to a height of the support member in the second gap region, and a height direction of the support member is a direction perpendicular to a plane on which a surface of the lower-layer substrate is located.

Therefore, the heights of the support members have diversified possible changes, and selection of an actual height of the support member needs to meet the following requirements: No solder bridging occurs between adjacent solder joints, and an open soldering problem in which no effective solder joint can be formed also needs to be avoided. That is, the heights of the support members can be designed based on an actual situation under the foregoing conditions, with strong flexibility and a wide application range.

In a possible implementation, the plurality of support members are distributed in the first gap region at intervals, and are supported between the upper-layer substrate and the lower-layer substrate; and heights of the support members are the same or different, and a height direction of the support member is a direction perpendicular to a plane on which a surface of the lower-layer substrate is located.

Therefore, the heights of the support members have diversified possible changes, and selection of an actual height of the support member needs to meet the following requirements: No solder bridging occurs between adjacent solder joints, and an open soldering problem in which no effective solder joint can be formed also needs to be avoided. That is, the heights of the support members can be designed based on an actual situation under the foregoing conditions, with strong flexibility and a wide application range.

In a possible implementation, a cross-sectional shape of the support member in a height direction of the support member includes one or a combination of a U shape, a rectangle, and an arc, and the height direction of the support member is a direction perpendicular to a plane on which a surface of the lower-layer substrate is located.

In a possible implementation, the support member is fixed to the upper-layer substrate; or the support member is fixed to the lower-layer substrate; or two ends of the support member are respectively fixed to the upper-layer substrate and the lower-layer substrate.

It may be understood that the support member may be fixed to the single-side substrate, or may be fixed to the dual-side substrates. A connection status between the support member and the upper-layer substrate and a connection status between the support member and the lower-layer substrate can be designed based on reliability and stress distribution of a support position that needs to be supported. This is not strictly limited in embodiments of this application. For example, the support member may be fixed to the upper-layer substrate and/or the lower-layer substrate through soldering or gluing.

In a possible implementation, a type of the support member includes an electronic element or a gasket, and a material of the gasket includes, but not limited to, metal, plastic, or ceramic.

For example, the electronic element may be a resistor or a capacitor. The gasket may be made of one or more metal materials, for example, a copper alloy. Alternatively, the gasket may be made of a ceramic material, a plastic material, or the like.

In a possible implementation, the board-level structure further includes a plurality of first soldering structures and a plurality of second soldering structures, and each of the first soldering structures and each of the second soldering structures are located between the upper-layer substrate and the lower-layer substrate, and conduct the upper-layer substrate and the lower-layer substrate; and the plurality of first soldering structures are arranged in the first gap region at intervals, and the plurality of second soldering structures are arranged in the second gap region at intervals.

Specifically, in the first gap region, the plurality of first soldering structures can implement a physical connection between the upper-layer substrate and the lower-layer substrate, and can further conduct the upper-layer substrate and the lower-layer substrate, to implement an electrical connection between the upper-layer substrate and the lower-layer substrate. That is, the plurality of first soldering structures have dual connection performance of physical and electrical connections. In the second gap region, the plurality of second soldering structures can implement a physical connection between the upper-layer substrate and the lower-layer substrate, and can further conduct the upper-layer substrate and the lower-layer substrate, to implement an electrical connection between the upper-layer substrate and the lower-layer substrate. That is, the plurality of second soldering structures have dual connection performance of physical and electrical connections.

It may be understood that each first soldering structure and each second soldering structure may be understood as one solder joint described above. A reliable connection relationship can be formed between the upper-layer substrate and the lower-layer substrate by forming the plurality of first soldering structures and the plurality of second soldering structures.

Based on the foregoing description, it should be understood that because a height of the first soldering structure needs to match a distance between the upper-layer substrate and the lower-layer substrate in the first gap region, and a height of the second soldering structure needs to match a distance between the upper-layer substrate and the lower-layer substrate in the second gap region, the height of the first soldering structure is inconsistent with the height of the second soldering structure. The heights of the first soldering structure and the second soldering structure may be understood as sizes of the first soldering structure and the second soldering structure in a direction perpendicular to the upper-layer substrate, or may be understood as sizes of the first soldering structure and the second soldering structure in a direction perpendicular to the lower-layer substrate. For example, the height of the second soldering structure is greater than the height of the first soldering structure.

In a possible implementation, the first gap region surrounds the second gap region; or the second gap region surrounds the first gap region.

For example, there may be one first gap region, and there may also be one second gap region. The second gap region may surround the first gap region, to present gap distribution of the small gap region in the middle and the large gap region at the edge.

Alternatively, there may be one first gap region, and there may also be one second gap region. The first gap region may surround the second gap region, to present gap distribution of the large gap region in the middle and the small gap region at the edge.

Alternatively, there may be one first gap region, and there may be two second gap regions. One first gap region is disposed between the two second gap regions, to present approximately W-shaped gap distribution.

Alternatively, there may be two first gap regions, there may be one second gap region. One second gap region is disposed between the two first gap regions, to present approximately M-shaped gap distribution.

In a possible implementation, a difference between a gap of the second gap region and a gap of the first gap region is greater than or equal to 100 μm, and the gap is the vertical distance between the upper-layer substrate and the lower-layer substrate.

That is, any position is selected from each of the first gap region and the second gap region, H1 represents the vertical distance between the upper-layer substrate and the lower-layer substrate at the selected position of the first gap region, H2 represents the vertical distance between the upper-layer substrate and the lower-layer substrate at the selected position of the second gap region, and a difference between H2 and H1 is greater than or equal to 100 μm.

In a possible implementation, the board-level structure further includes a chip, and the chip is packaged on a side that is of the upper-layer substrate and that is away from the lower-layer substrate.

In a possible implementation, the first soldering structure includes a first solder ball disposed on the upper-layer substrate; and the first solder ball includes a solder ball body and a solder flux layer, and the solder flux layer covers at least a part of an outer surface of the solder ball body.

Under this setting, a tin amount for forming a solder joint in a soldering process is formed by only the first solder ball of the upper-layer substrate, that is, all soldering materials required for forming the solder joint are integrated on the first solder ball of the upper-layer substrate. Therefore, no solder paste needs to be brushed on a lower-layer pad, which helps better control the tin amount in the small gap region and avoid a soldering defect of solder bridging in the first gap region.

It may be understood that, the solder flux layer is disposed on the outer surface of the solder ball body, so that a soldering process can be facilitated and promoted in a soldering process by using a functional function of a solder flux, and the solder flux layer also has a protective function, and can prevent an oxidation reaction. This structure enables the solder joint to have a small tin amount, which is helpful to further avoid occurrence of the soldering defect of solder bridging. Alternatively, a solder flux may be applied to a pad on a side of the lower-layer substrate instead of covering the first solder ball, which can also remove an oxide film and prevent oxidation.

In a possible implementation, the solder ball body is made of soldering tin.

The solder ball body may also include a core layer and a tin layer wrapping an outer surface of the core layer, where at least a part of the tin layer is connected to the solder flux layer, and a melting point of the core layer is higher than a melting point of the tin layer.

For example, the core layer may be a spherical core with a high melting point that does not melt in a heating and soldering process. The tin layer may be slightly thicker than conventional thin tin. On the one hand, it is ensured that the core layer is completely wrapped by the tin layer, and on the other hand, because the tin layer is an important part of the solder joint, a sufficient tin amount needs to be reserved to minimize a possibility of occurrence of a soldering defect in which no effective solder joint can be formed. Therefore, the first solder ball may present a form in which "the spherical core is wrapped by soldering tin" as a whole.

It should be noted that, in this implementation, because the solder ball body includes the core layer, a size of the core layer may be less than a size of a conventional solder ball, to ensure that a size of the entire first solder ball is equal to the size of the conventional solder ball or is slightly greater than the size of the conventional solder ball.

In a possible implementation, the core layer is a spherical support structure.

In a possible implementation, the first soldering structure includes a first solder ball and a first solder structure, the first solder ball is disposed on the upper-layer substrate, the first solder structure is disposed on the lower-layer substrate, and a material of the first solder structure includes a paste flux or a solder paste having 50% alloy.

That is, in a process of heating and soldering the upper-layer substrate and the lower-layer substrate, the first solder ball and the first solder structure jointly form a solder joint. For example, the material of the first solder structure includes the solder paste having the 50% alloy. Alternatively, the material of the first solder structure includes the paste flux.

Under this setting, a tin amount for forming the solder joint in the soldering process may be jointly formed by the first solder ball of the upper-layer substrate and the first solder structure of the lower-layer substrate. Therefore, the control of the tin amount of the solder joint can be adjusted bidirectionally, which facilitates better control of the tin amount in the small gap region and avoids occurrence of the soldering defect of solder bridging in the first gap region.

In a possible implementation, the second soldering structure includes a second solder ball and a second solder structure, the second solder ball is disposed on the upper-layer substrate, the second solder structure is disposed on the lower-layer substrate, and a material of the second solder structure includes prefabricated tin having a 100% alloy and/or a solder paste having 50% alloy.

It may be understood that a tin amount for forming the solder joint in the soldering process may be jointly formed by the second solder ball of the upper-layer substrate and the second solder structure of the lower-layer substrate. That is, the control of the tin amount of the second soldering structure may be adjusted bidirectionally by controlling a tin amount of the second solder ball, or by controlling a tin amount of the second solder structure, or by controlling a tin amount of the second solder ball and a tin amount of the second solder structure. This setting helps better control the tin amount and match deformed gap distribution in the large gap region (the second gap region), to avoid the soldering defect of open soldering in the first gap region.

The prefabricated tin has the 100% alloy, and a tin amount of the prefabricated tin is 50% different from that of the solder paste having the 50% alloy under a same volume. When a tin amount in the large gap region (the second gap region) is insufficient, if the tin amount is increased by increasing the solder paste, a solder bridging problem may be caused. The prefabricated tin can meet a tin amount requirement in the large gap region to the maximum extent, and can further avoid an open soldering defect that is easily generated in the large gap region.

In a possible implementation, when the second solder structure includes the solder paste having the 50% alloy, a tin amount of the second solder structure is greater than a tin amount of the first solder structure.

Therefore, a difference between the gap of the first gap region and the gap of the second gap region can be adapted. For example, a tin amount of the solder paste may be controlled in a tin spraying manner, to adapt to the deformed gap distribution in the second gap region.

In a possible implementation, a surface that is of each second solder ball and that is in contact with a corresponding second solder structure is an arc surface, and surfaces that are of at least some second solder structures and that are in contact with corresponding second solder balls are planes.

In this way, contact stability between the second solder ball and the second solder structure can be ensured, and a problem that misalignment may occur between the upper-layer substrate and the lower-layer substrate in an assembly process due to relative sliding between the second solder ball and the second solder structure, and electrical reliability of the board-level structure is affected is avoided.

In a possible implementation, heights of the second solder structures are the same, and a height direction of the second solder structure is a direction perpendicular to the plane on which the surface of the lower-layer substrate is located.

It may be understood that a tin amount for forming the solder joint in the soldering process may be jointly formed by the second solder ball of the upper-layer substrate and the second solder structure of the lower-layer substrate. That is, the control of the tin amount of the second soldering structure may be adjusted bidirectionally by controlling a tin amount of the second solder ball, or by controlling a tin amount of the second solder structure, or by controlling a tin amount of the second solder ball and a tin amount of the second solder structure. In addition, inconsistent heights of the second solder structures help better control the tin amount and match deformed gap distribution in the large gap region (the second gap region), to avoid the soldering defect of open soldering in the first gap region.

Alternatively, the heights of the second solder structures are different, and the height of the second solder structure is a size of the second solder structure in a direction perpendicular to the lower-layer substrate.

Based on the foregoing description, it should be understood that the height of the second solder structure can be flexibly adjusted based on an actual situation, to accurately match a tin amount in a deformed region, and minimize a possibility of occurrence of a soldering defect.

In a possible implementation, all the second solder structures are prefabricated solder balls made of prefabricated tin; or all the second solder structures are prefabricated solder sheets made of prefabricated tin; or some of the second solder structures are prefabricated solder balls made of prefabricated tin, and others of the second solder structures are prefabricated solder sheets made of the prefabricated tin.

Specifically, each of the second solder structures is the prefabricated solder ball made of the prefabricated tin.

A surface that is of the prefabricated solder ball and that is in contact with the second solder ball is a plane.

It should be noted that, a case in which the surface that is of the prefabricated solder ball and that is in contact with the second solder ball is the plane may include a case in which the surface that is of the prefabricated solder ball and that is in contact with the second solder ball is not arc-shaped, or may include a case in which the surface that is of the prefabricated solder ball and that is in contact with the second solder ball is an approximate plane with a tiny arc surface. It should be understood that, the plane is a surface form that allows the second solder ball to be placed on the prefabricated solder ball without sliding between the second solder ball and the prefabricated solder ball, so that a subsequent soldering process can be performed more smoothly.

It may be understood that because the second solder ball is spherical, a surface that is of the second solder ball and that is in contact with the prefabricated solder ball is an arc surface. In addition, if the surface that is of the prefabricated solder ball and that is in contact with the second solder ball is also an arc surface, contact between the two arc surfaces causes relative sliding between the prefabricated solder ball and the second solder ball, and consequently, misalignment may occur between the upper-layer substrate and the lower-layer substrate in the assembly process, affecting electrical reliability of the board-level structure. Therefore, the surface that is of the prefabricated solder ball and that is in contact with the second solder ball is set to the plane, so that a possibility of occurrence of such a problem can be fully avoided, and reliability is good.

Alternatively, the surface that is of the prefabricated solder ball and that is in contact with the second solder ball is the arc surface, and the connection assembly further includes a limiting apparatus, where the limiting apparatus is configured to limit relative sliding between the prefabricated solder ball and the second solder ball.

It may be understood that because both the outer surfaces of the second solder ball and the prefabricated solder ball are the arc surfaces, to avoid the upper-layer substrate from sliding off the lower-layer substrate due to contact between the two arc surfaces, the limiting apparatus is additionally disposed to limit relative sliding between the upper-layer substrate and the lower-layer substrate, thereby improving alignment stability between the upper-layer substrate and the lower-layer substrate.

Alternatively, the surface that is of the prefabricated solder ball and that is in contact with the second solder ball is the arc surface, the connection assembly further includes a collapsible structural member, the collapsible structural member is located in the second gap region and is supported between the upper-layer substrate and the lower-layer substrate, and the collapsible structural member can be melted during heating and soldering of the connection assembly.

For example, there are two collapsible structural members, and the two collapsible structural members are respectively supported on two sides of the second gap region. In addition, the collapsible structural member may be a soldering tin material that can be melt and collapse in a heating and soldering process, and can be supported between the upper-layer substrate and the lower-layer substrate before the heating and soldering.

It may be understood that because both the outer surfaces of the second solder ball and the prefabricated solder ball are the arc surfaces, to avoid the upper-layer substrate from sliding off the lower-layer substrate due to contact between the two arc surfaces, the collapsible structural member is additionally disposed to limit relative sliding between the upper-layer substrate and the lower-layer substrate, thereby improving the alignment stability between the upper-layer substrate and the lower-layer substrate.

It should be noted that the collapsible structural member is spaced apart from the second solder ball and the second solder structure that form the second soldering structure, so as not to affect formation of the solder joint. A shape of a pad connected to the collapsible structural member needs to adapt to the collapsible structural member, and the collapsible structural member only needs to be supported between the upper-layer substrate and the lower-layer substrate. A quantity, a shape, and a connection position of the collapsible structural member are not strictly limited.

In a possible implementation, each second solder structure is a prefabricated solder sheet made of the prefabricated tin, and a surface that is of the prefabricated solder sheet and that is in contact with the second solder ball is a plane.

It may be understood that the prefabricated solder sheet not only has a function of adjusting a tin amount, but also has a support function. The prefabricated solder sheet can prevent the second solder ball from sliding on the lower-layer substrate, and has good stability.

For example, the prefabricated solder sheet may be in a "U" shape, or the prefabricated solder sheet may be in a column shape. It should be noted that the shape of the prefabricated solder sheet is not limited to the foregoing two shapes, and a shape having stable support performance is applicable. This is not strictly limited in the technical solution of this application.

In a possible implementation, some second solder structures are prefabricated solder balls made of the prefabricated tin, and a surface that is of the prefabricated solder ball and that is in contact with the second solder ball is an arc surface; and some other second solder structures are prefabricated solder sheets made of the prefabricated tin, and a surface that is of the prefabricated solder sheet and that is in contact with the second solder ball is a plane.

It may be understood that, some second solder structures are set to the prefabricated solder balls, and some other second solder structures are set to the prefabricated solder sheets, so that some prefabricated solder balls can be kept in an arc shape on an outer surface without performing process processing, thereby reducing material management costs and production costs during assembly of the board-level structure, and helping improve production efficiency.

In a possible implementation, outer surfaces of all second solder structures are arc surfaces, and surfaces that are of at least some second solder balls and that are in contact with corresponding second solder structure are planes.

In this way, contact stability between the second solder ball and the second solder structure can be ensured, and a problem that misalignment may occur between the upper-layer substrate and the lower-layer substrate in an assembly process due to relative sliding between the second solder ball and the second solder structure, and electrical reliability of the board-level structure is affected is avoided.

In a possible implementation, a surface that is of each second solder ball and that is in contact with a corresponding second solder structure is an arc surface, and surfaces that are of all second solder structures and that are in contact with corresponding second solder balls are arc surfaces.

The board-level structure further includes a limiting apparatus, where the limiting apparatus is configured to limit relative sliding between the prefabricated solder ball and the second solder ball; or the board-level structure further includes a collapsible structural member, and the collapsible structural member is located in the second gap region and is supported between the upper-layer substrate and the lower-layer substrate.

In a possible implementation, the plurality of support members are distributed in the first gap region and the second gap region at intervals, and each of the support members is located between the upper-layer substrate and the lower-layer substrate, and conducts the upper-layer substrate and the lower-layer substrate; and the support member in the first gap region and/or the support member in the second gap region includes a core structure and a soldering material layer wrapping around a periphery of the core structure, and a melting point of the core structure is higher than a melting point of the soldering material layer.

In a possible implementation, there is one first gap region, there is also one second gap region, and the first gap region is located on at least one side outside the second gap region; or the second gap region is located on at least one side outside the first gap region.

In a possible implementation, the board-level structure further includes a chip, and the chip is packaged on a side that is of the upper-layer substrate and that is away from the lower-layer substrate.

According to a second aspect, this application further provides a communication device, where the communication device includes a mounting frame and the foregoing board-level structure, and the board-level structure is mounted on the mounting frame.

DESCRIPTION OF EMBODIMENTS

For ease of understanding, terms in embodiments of this application are first explained.

The term and/or describes only an association relationship for describing associated objects and represents that at least three relationships may exist. For example, a and/or b may represent the following three cases: Only a exists, both a and b exist, and only b exists.

A plurality of means two or more.

Fix should be understood in a broad sense. For example, if a is fixed to b, a may be directly connected to b and a relative location after the connection does not change, or a may be indirectly connected to b through an intermediate medium and a relative location after the connection does not change.

The following clearly describes specific implementations of this application with reference to the accompanying drawings.

An embodiment of this application provides a communication device. The communication device may be, but not limited to, a server, a router, a switch, a super computer, an AI device, and a data center.

Figure 1:
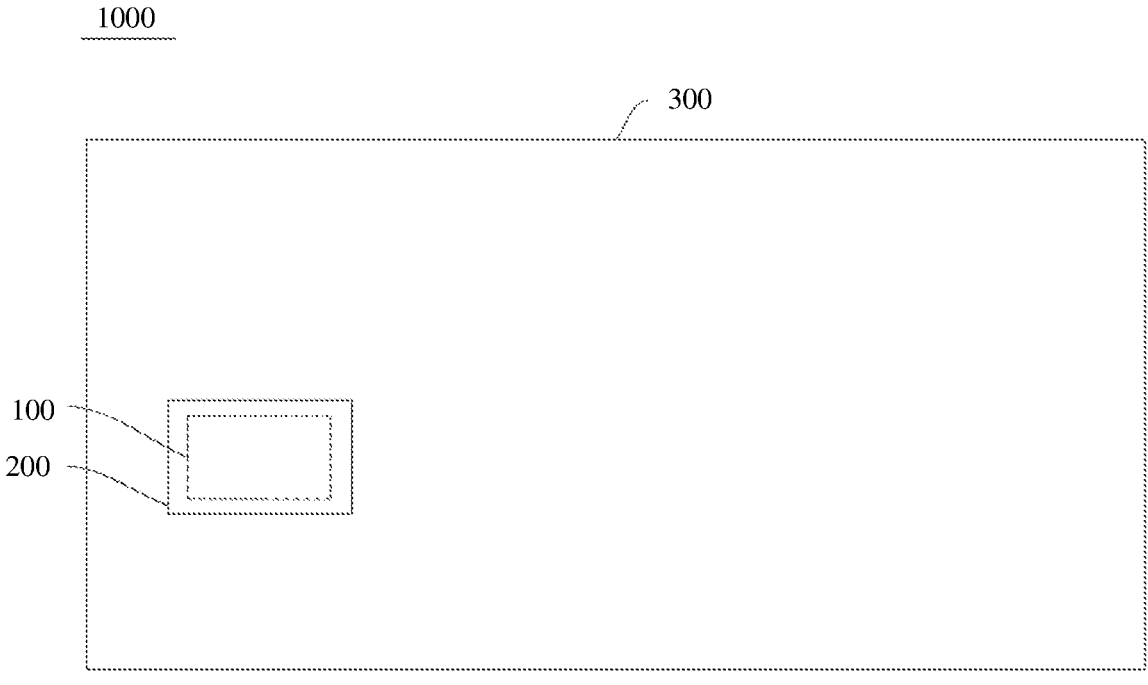
FIG. 1 is an example schematic diagram of a communication device according to an embodiment of this application.

Refer to FIG. 1. A communication device 1000 may include a board-level structure 100, a mounting frame 200, and a housing 300. The housing 300 can accommodate components such as the board-level structure 100 and the mounting frame 200 of the communication device 1000, to avoid damage caused by external mechanical damage. The board-level structure 100 may be understood as a board-level assembly architecture formed by assembling a package structure 60 to a carrier. The mounting frame 200 may also be referred to as a subrack, and may be understood as a structure that can provide physical support and electrical interconnection for the board-level structure 100. The board-level structure 100 is mounted on the mounting frame 200, so that a position of the board-level structure 100 in the communication device 1000 is fixed, and an electrical connection to another electronic component can be implemented.

It should be understood that the board-level structure 100 may be any assembly architecture formed by assembling a Ball Grid Array (BGA) package or a structural member to a carrier. For example, the BGA package and the structural member may also be BGA sockets. This is not strictly limited herein. An example in which the BGA package or the structural member is the package structure 60 is used for description. In a case in which no conflict occurs, these descriptions may be applied to the foregoing BGA package and structural member such as the BGA socket.

It should be noted that FIG. 1 is merely intended to schematically describe a connection relationship among the board-level structure 100, the mounting frame 200, and the housing 300, but is not intended to specifically limit connection locations, specific configurations, and quantities of the devices. The structure shown in this embodiment of this application does not constitute a specific limitation on the communication device 1000. In some other embodiments of this application, the communication device 1000 may include more or fewer components than those shown in the figure, combine some components, split some components, or have different component arrangements. The components shown in the figure may be implemented by using hardware, software, or a combination of software and hardware.

Refer to FIG. 2 to FIG. 11. The board-level structure 100 includes an upper-layer substrate 10, a lower-layer substrate 20, and a plurality of support members 50.

The upper-layer substrate 10 may be understood as a package substrate in the package structure 60. The package substrate is a carrier for packaging a semiconductor chip 61, and may provide functions such as an electrical connection, protection, support, heat dissipation, and assembly for the chip 61. The package structure 60 may be formed by, for example, disposing an input/output (I/O) outlet pin that is electrically connected to the lower-layer substrate 20 on a back side of the upper-layer substrate 10 and packaging an electronic component such as the chip 61 on a front side of the upper-layer substrate 10. A specific structure of the package structure 60 is described in detail below.

The lower-layer substrate 20 may be understood as the foregoing carrier, and can carry the package structure 60 and can be assembled to the package structure 60, thereby implementing electrical interconnection with the package structure 60.

The package structure 60 needs to be assembled to the lower-layer substrate 20, and assembly of the package structure 60 and the lower-layer substrate 20 may be equivalent to assembly of the upper-layer substrate 10 and the lower-layer substrate 20. Therefore, control of assembly quality of the upper-layer substrate 10 and the lower-layer substrate 20 is particularly important. An example in which the upper-layer substrate 10 and the lower-layer substrate 20 are assembled through soldering is used for detailed description.

It may be understood that, at normal temperature, the upper-layer substrate 10 and the lower-layer substrate 20 may have warping deformation, and in a soldering process of the upper-layer substrate 10 and the lower-layer substrate

20, the warping deformation changes with a temperature. Consequently, a quality risk of soldering the upper-layer substrate 10 and the lower-layer substrate 20 is increased sharply, assembly difficulty is increased, and especially, soldering defects of solder bridging and open soldering occur simultaneously. The solder bridging may be understood as a soldering defect in which two adjacent solder joints between the upper-layer substrate 10 and the lower-layer substrate 20 are bridged together in the soldering process, and is represented as a short circuit in an electrical function. The open soldering may be understood as a soldering defect in which no effective solder joint is formed between the upper-layer substrate 10 and the lower-layer substrate 20, and is represented as an open circuit in the electrical function. Based on the foregoing description, a corresponding assembly design needs to be performed for assembly between the upper-layer substrate 10 and the lower-layer substrate 20, so as to ensure that a good solder joint structure can be formed between the upper-layer substrate 10 and the lower-layer substrate 20.

Therefore, according to the board-level structure 100 provided in this embodiment of this application, the solder bridging and open soldering problems caused by deformation of the upper-layer substrate 10 and the lower-layer substrate 20 can be resolved, a board-level assembly requirement and soldering quality of a large-deformed substrate are met, and high reliability and stability of a circuit system of the board-level structure 100 in a normal working process are ensured. Details are further described below.

Refer to FIG. 12 to FIG. 15. There is a gap between the upper-layer substrate 10 and the lower-layer substrate 20, and the gap includes a first gap region A and a second gap region B in a plane in which an orthographic projection of the upper-layer substrate 10 is located. The first gap region A and the second gap region B are spaced, and a spaced region between the first gap region A and the second gap region B does not include the first gap region A or the second gap region B. Specifically, that the first gap region A and the second gap region B are spaced may mean that the first gap region A and the second gap region B that are adjacent to each other are spaced, and the adjacent may be understood as that the first gap region A and the second gap region B are not in contact with each other, but a distance difference between the first gap region A and the second gap region B is small.

In this embodiment of this application, a vertical distance between the upper-layer substrate 10 and the lower-layer substrate 20 in the first gap region A is less than a vertical distance between the upper-layer substrate 10 and the lower-layer substrate 20 in the second gap region B, a maximum vertical distance between the upper-layer substrate 10 and the lower-layer substrate 20 in the first gap region A is less than a minimum vertical distance between the upper-layer substrate 10 and the lower-layer substrate 20 in the second gap region B, and a difference between the minimum vertical distance and the maximum vertical distance is greater than or equal to 100 micrometers.

It should be understood that there may be one or more first gap regions A. There may be one or more second gap regions B. For example, when a quantity of first gap regions A is greater than or equal to 2, there is one second gap region B between every two adjacent first gap regions A. When a quantity of second gap regions B is greater than or equal to 2, there is one first gap region A between every two adjacent second gap regions B.

It should be noted that, for ease of illustration, FIG. 12 to FIG. 15 below show only a partial structure of the board-level structure 100. However, it should be understood that this is not limited thereto.

That is, in the board-level structure 100, vertical distances between the upper-layer substrate 10 and the lower-layer substrate 20 are inconsistent and are different. In other words, in gap distribution between the upper-layer substrate 10 and the lower-layer substrate 20, the first gap region A is a relatively small gap region, and the second gap region B is a relatively large gap region.

For example, a difference between a gap of the second gap region B and a gap of the first gap region A is greater than or equal to 100 μm, and the gap is the vertical distance between the upper-layer substrate 10 and the lower-layer substrate 20. That is, any position is selected from each of the first gap region A and the second gap region B, H1 represents the vertical distance between the upper-layer substrate 10 and the lower-layer substrate 20 at the selected position of the first gap region A, H2 represents the vertical distance between the upper-layer substrate 10 and the lower-layer substrate 20 at the selected position of the second gap region B, and a difference between H2 and H1 is greater than or equal to 100 μm.

It should be noted that in the first gap region A, the vertical distances between the upper-layer substrate 10 and the lower-layer substrate 20 may also be inconsistent and are different. In the second gap region B, the vertical distances between the upper-layer substrate 10 and the lower-layer substrate 20 may also be inconsistent and are different.

In a possible implementation, there may be one first gap region A, and there may also be one second gap region B. The second gap region B is located on at least one side outside the first gap region A, that is, the second gap region B may be located on one side, two sides, three sides, or four sides of the first gap region A. For example, the second gap region B may surround the first gap region A, to present gap distribution of the small gap region in the middle and the large gap region at the edge shown in FIG. 12.

In another possible implementation, there may be one first gap region A, and there may also be one second gap region B. The first gap region A is located on at least one side outside the second gap region B, that is, the first gap region A may be located on one side, two sides, three sides, or four sides of the second gap region B. For example, the first gap region A may surround the second gap region B, to present gap distribution of the large gap region in the middle and the small gap region at the edge shown in FIG. 13.

In still another possible implementation, there may be two first gap regions A, and there may be three second gap regions B. Each first gap region A is disposed between two adjacent second gap regions B, to present approximately W-shaped gap distribution shown in FIG. 14.

In yet another possible implementation, there may be three first gap regions A, and there may be two second gap regions B. Each second gap region B is disposed between two adjacent first gap regions A, to present approximately M-shaped gap distribution shown in FIG. 15.

It should be noted that the gap distribution between the upper-layer substrate 10 and the lower-layer substrate 20 is not limited to the foregoing several forms. The quantities of first gap regions A and second gap regions B and the relative positions of the first gap region A and the second gap region B may have diversified possible combinations, provided that there is differentiated gap distribution between the upper-layer substrate 10 and the lower-layer substrate 20. This is not strictly limited in embodiments of this application.

In a first embodiment of this application, the support member 50 does not participate in implementing electrical interconnection between the upper-layer substrate 10 and the lower-layer substrate 20, and is only used as a support structure that can support the upper-layer substrate 10 and the lower-layer substrate 20. Specifically, in this embodiment, refer to FIG. 2 to FIG. 10 again. The board-level structure 100 further includes a plurality of first soldering structures 30 and a plurality of second soldering structures 40. Each first soldering structure 30 and each second soldering structure 40 are located between the upper-layer substrate 10 and the lower-layer substrate 20, and conduct the upper-layer substrate 10 and the lower-layer substrate 20.

The plurality of first soldering structures 30 are connected between the upper-layer substrate 10 and the lower-layer substrate 20, and are distributed in the first gap region A at intervals. Specifically, in the first gap region A, the plurality of first soldering structures 30 can implement a physical connection between the upper-layer substrate 10 and the lower-layer substrate 20, and can further conduct the upper-layer substrate 10 and the lower-layer substrate 20, to implement an electrical connection between the upper-layer substrate 10 and the lower-layer substrate 20. That is, the plurality of first soldering structures 30 have dual connection performance of physical and electrical connections.

The plurality of second soldering structures 40 are connected between the upper-layer substrate 10 and the lower-layer substrate 20, and are distributed in the second gap region B at intervals. Specifically, in the second gap region B, the plurality first soldering structures 40 can implement a physical connection between the upper-layer substrate 10 and the lower-layer substrate 20, and can further conduct the upper-layer substrate 10 and the lower-layer substrate 20, to implement an electrical connection between the upper-layer substrate 10 and the lower-layer substrate 20. That is, the plurality of second soldering structures 40 have dual connection performance of physical and electrical connections.

It may be understood that each first soldering structure 30 and each second soldering structure 40 may be understood as one solder joint described above. A reliable connection relationship can be formed between the upper-layer substrate 10 and the lower-layer substrate 20 by forming the plurality of first soldering structures 30 and the plurality of second soldering structures 40.

Based on the foregoing description, it should be understood that because a height of the first soldering structure 30 needs to match a distance between the upper-layer substrate 10 and the lower-layer substrate 20 in the first gap region A, and a height of the second soldering structure 40 needs to match a distance between the upper-layer substrate 10 and the lower-layer substrate 20 in the second gap region B, the height of the first soldering structure 30 is inconsistent with the height of the second soldering structure 40. The heights of the first soldering structure 30 and the second soldering structure 40 may be understood as sizes of the first soldering structure 30 and the second soldering structure 40 in a direction perpendicular to the upper-layer substrate 10, or may be understood as sizes of the first soldering structure 30 and the second soldering structure 40 in a direction perpendicular to the lower-layer substrate 20. For example, the height of the second soldering structure 40 is greater than the height of the first soldering structure 30.

Specifically, in the first gap region A, the height of each first soldering structure 30 may match a change of a gap between the upper-layer substrate 10 and the lower-layer substrate 20 in the first gap region A, to present a structure form of a consistent height or inconsistent heights. In the second gap region B, the height of each second soldering structure 40 may match a change of a gap between the upper-layer substrate 10 and the lower-layer substrate 20 in the second gap region B, to present a structure form of a consistent height or inconsistent heights.

In this way, distribution of gaps at different positions between the upper-layer substrate 10 and the lower-layer substrate 20 caused by deformation of the upper-layer substrate 10 and the lower-layer substrate 20 can be fully considered, so that heights of solder joints (the first soldering structures 30 and the second soldering structures 40) between the upper-layer substrate 10 and the lower-layer substrate 20 may correspond to the distribution of the gaps between the upper-layer substrate 10 and the lower-layer substrate 20. This setting enables a soldering material used to form the solder joint to accurately match the gap distribution between the upper-layer substrate 10 and the lower-layer substrate 20. On the one hand, a soldering defect of solder bridging between two adjacent solder joints caused by use of excessive soldering materials can be avoided, process costs and material management costs of the board-level structure 100 can be effectively reduced, and production efficiency of the board-level structure 100 can be improved. On the other hand, a possibility of a soldering defect of open soldering in which no effective solder joint is formed between the upper-layer substrate 10 and the lower-layer substrate 20 due to insufficient soldering materials can be minimized, so that a stable and reliable electrical connection relationship is formed between the upper-layer substrate 10 and the lower-layer substrate 20.

In other words, accurate soldering material matching is performed based on deformed gap distribution between the upper-layer substrate 10 and the lower-layer substrate 20, so that soldering problems such as solder bridging and open soldering caused by deformation of the upper-layer substrate 10 and the lower-layer substrate 20 can be resolved to the maximum extent, and board-level assembly reliability of the upper-layer substrate 10 and the lower-layer substrate 20 is ensured.

In this embodiment, the support member 50 has a support function, and can be supported between the upper-layer substrate 10 and the lower-layer substrate 20, thereby effectively ensuring a minimum support height between the upper-layer substrate 10 and the lower-layer substrate 20 in which the soldering defects such as solder bridging and open soldering do not occur. A shape of the support member 50 has diversified possibilities. A cross-sectional shape of the support member 50 in a height direction of the support member 50 includes one or a combination of a U shape, a rectangle, and an arc, and the height direction of the support member 50 is a direction perpendicular to a plane on which a surface of the lower-layer substrate 20 is located. For example, the support member 50 may be cylindrical, or the support member 50 may be U-shaped, or the support member 50 may be frustum-shaped, or the support member 50 may be spherical. It should be understood that a form of the support member 50 is not limited to the foregoing shapes, and all geometric shapes that can play a support role and that can be manufactured in a machinable range may be used as the support member 50. This is not strictly limited in embodiments of this application.

In a possible implementation, a type of the support member 50 may be an electronic element. For example, the electronic element may be a resistor or a capacitor.

In another possible implementation, the type of the support member 50 may be a gasket. For example, the gasket may be made of one or more metal materials, for example, a copper alloy. Alternatively, the gasket may be made of a material such as ceramic or plastic.

It should be noted that a type possibility of the support member 50 is not limited to the foregoing descriptions, and the support member 50 may be any object that has both a high melting point and a support function and that is not melted in a soldering process. This is not strictly limited in embodiments of this application.

Refer to FIG. 2 to FIG. 10. The plurality of support members 50 may be distributed in the first gap region A and/or the second gap region B at intervals. In other words, the plurality of support members 50 have at least the following three layout solutions.

Layout solution 1: The plurality of support members 50 are distributed in the first gap region A and the second gap region B at intervals.

Layout solution 2: The plurality of support members 50 are distributed in the first gap region A at intervals.

Layout solution 3: The plurality of support members 50 are distributed in the second gap region B at intervals.

The following describes in detail the three layout solutions of the plurality of support members 50.

Refer to FIG. 2, FIG. 3, FIG. 4, FIG. 5, and FIG. 6. In the layout solution 1, the plurality of support members 50 are distributed in the first gap region A and the second gap region B at intervals.

It may be understood that the first gap region A is a relatively small gap region, and in the first gap region A, a solder bridging defect may occur on two adjacent solder joints in a normal case. Therefore, the support member 50 is arranged in the first gap region A, so that a specific interval can be always maintained between the upper-layer substrate 10 and the lower-layer substrate 20 through a support function of the support member 50, to effectively minimize a possibility that solder bridging occurs on two adjacent solder joints when a soldering material collapses because deformation of the upper-layer substrate 10 and the lower-layer substrate 20 increases with a change of a temperature in a process of heating and soldering the upper-layer substrate 10 and the lower-layer substrate 20, thereby ensuring reliability of a circuit system of the board-level structure 100.

In addition, the second gap region B is a relatively large gap region, and in the second gap region B, the solder bridging defect is not likely to occur on two adjacent solder joints in a normal case. However, considering fluctuation between batches of soldering incoming materials and a dynamic change of a single material in a soldering process, a soldering problem of solder bridging may also be generated between the two adjacent solder joints in a specific case. Therefore, the support member 50 is arranged in the second gap region B, so that a possibility that such a soldering defect occurs can be minimized, and a good prevention effect is achieved.

Based on the foregoing description, it should be understood that both the first gap region A and the second gap region B may be considered as risk regions in which solder bridging occurs. The support member 50 is added to the risk region, so that even if the soldering material collapses under the action of a weight of the upper-layer substrate 10 and a surface tension of the soldering material, a soldering defect of solder bridging is not likely to occur in the first gap region A and the second gap region B due to a support capability of the support member 50 and a support height of the support member 50, and electrical interconnection performance between the upper-layer substrate 10 and the lower-layer substrate 20 is excellent.

In this solution, it should be understood that because the plurality of support members 50 do not participate in forming of the solder joint, the support members 50 are spaced apart from the first soldering structures 30 and the second soldering structures 40, to avoid an adverse impact on the solder joint.

Refer to FIG. 2, FIG. 3, FIG. 4, FIG. 5, and FIG. 6. In the first gap region A, the support member 50 is supported between the upper-layer substrate 10 and the lower-layer substrate 20. That is, two ends of the support member 50 in the first gap region A respectively abut against the upper-layer substrate 10 and the lower-layer substrate 20. In this way, the support member 50 in the first gap region A can support the upper-layer substrate 10 and the lower-layer substrate 20, to minimize a possibility that a solder bridging defect is generated between two adjacent solder joints in the small gap region because the soldering material can only collapse horizontally due to an insufficient longitudinal interval between the upper-layer substrate 10 and the lower-layer substrate 20 (that is, the vertical distance between the upper-layer substrate 10 and the lower-layer substrate 20), and consequently, the two adjacent solder joints are bridged together due to excessive collapse, and ensure that the solder bridging defect does not occur between the two adjacent solder joints because there is a proper interval between the upper-layer substrate 10 and the lower-layer substrate 20, thereby helping reduce assembly difficulty between the upper-layer substrate 10 and the lower-layer substrate 20.

Figure 2:
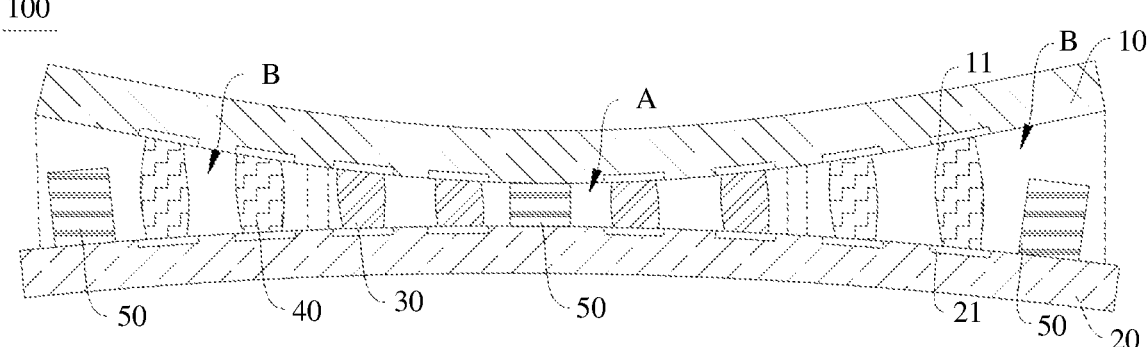
FIG. 2 is an example schematic diagram of a structure of a layout solution 1 of a plurality of support members of a board-level structure according to a first embodiment of this application.
Figure 3:
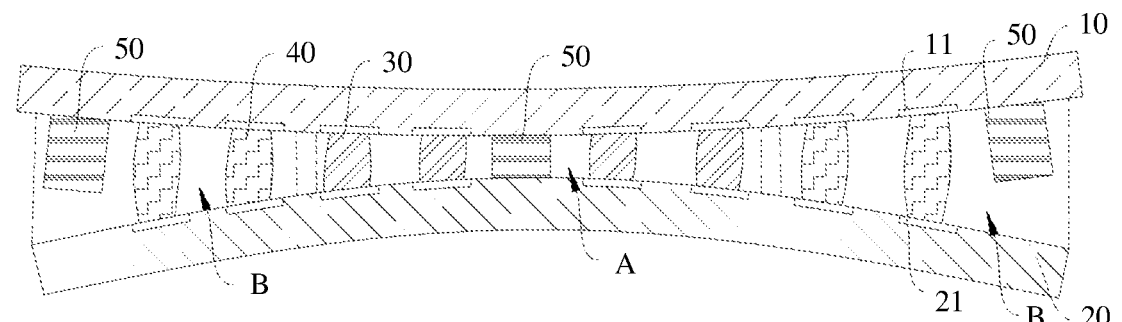
FIG. 3 is another example schematic diagram of a structure of a layout solution 1 of a plurality of support members of a board-level structure according to a first embodiment of this application.
Figure 4:
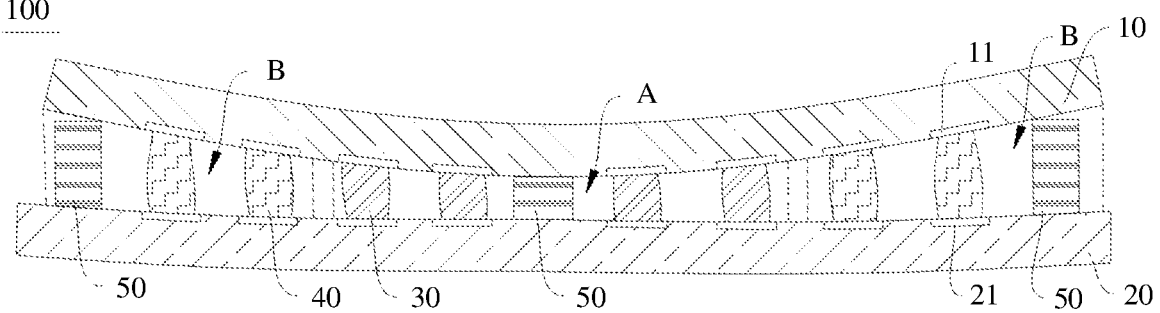
FIG. 4 is still another example schematic diagram of a structure of a layout solution 1 of a plurality of support members of a board-level structure according to a first embodiment of this application.

It should be noted that, refer to FIG. 2, FIG. 3, and FIG. 4. In the first gap region A, a case in which the support member 50 is supported between the upper-layer substrate 10 and the lower-layer substrate 20, and two ends of the support member 50 abut against the upper-layer substrate 10 and the lower-layer substrate 20 may include: The support member 50 is fixed to the upper-layer substrate 10, and one end that is of the support member 50 and that is away from the upper-layer substrate 10 abuts against the lower-layer substrate 20, or the support member 50 is fixed to the lower-layer substrate 20, and one end that is of the support member 50 and that is away from the lower-layer substrate 20 abuts against the upper-layer substrate 10, or two ends of the support member 50 are respectively fixed to the upper-layer substrate 10 and the lower-layer substrate 20.

In other words, the support member 50 may be fixed to the single-side substrate, or may be fixed to the dual-side substrates. A connection status between the support member 50 and the upper-layer substrate 10 and a connection status between the support member 50 and the lower-layer substrate 20 can be designed based on reliability and stress distribution of a support position that needs to be supported. This is not strictly limited in embodiments of this application. For example, the support member 50 may be fixed to the upper-layer substrate 10 and/or the lower-layer substrate 20 through soldering or gluing.

Figure 5:
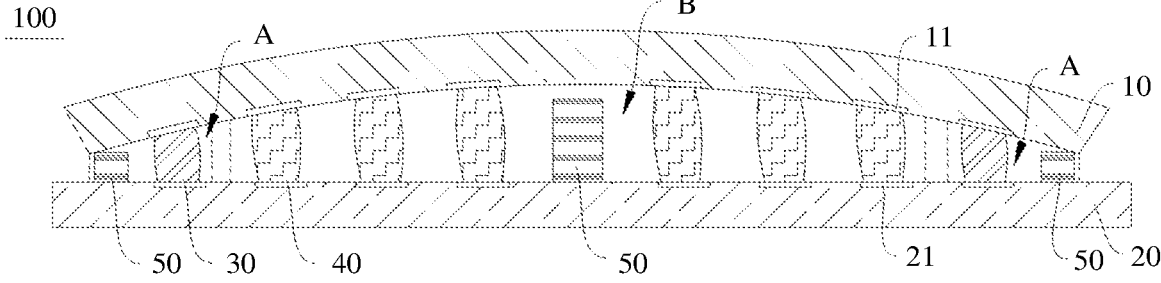
FIG. 5 is yet another example schematic diagram of a structure of a layout solution 1 of a plurality of support members of a board-level structure according to a first embodiment of this application.
Figure 6:
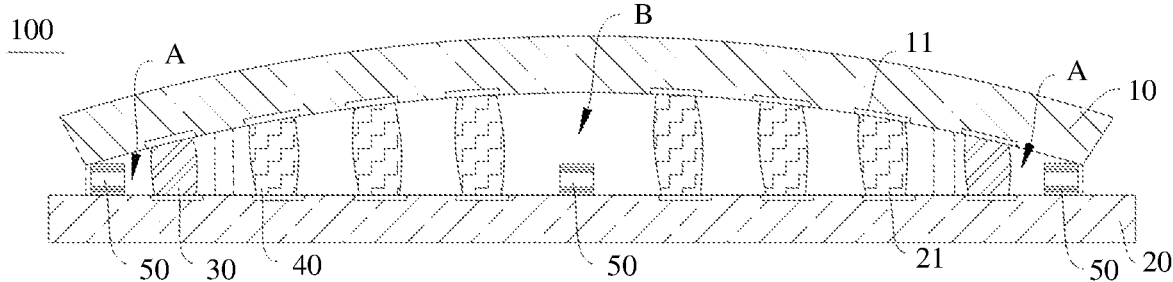
FIG. 6 is a fifth example schematic diagram of a structure of a layout solution 1 of a plurality of support members of a board-level structure according to a first embodiment of this application.

In a possible implementation, in the second gap region B, as shown in FIG. 3, one end of two ends of the support member 50 abuts against the upper-layer substrate 10, and the other end of the two ends of the support member 50 is spaced (isolated) apart from the lower-layer substrate 20. Alternatively, as shown in FIG. 2, FIG. 5, and FIG. 6, one end of two ends of the support member 50 abuts against the lower-layer substrate 20, and the other end of the two ends of the support member 50 is spaced apart from the upper-layer substrate 10. That is, the support member 50 in the second gap region B is in contact with only the upper-layer substrate 10 or the lower-layer substrate 20, and is not in contact with the substrate on the other opposite side. In other words, in this implementation, the support member 50 is connected to only the one-side substrate, and fixing stability of the support member 50 can be ensured.

It may be understood that, in this implementation, because the support member 50 in the second gap region B is in contact with only the single-side substrate, the support member 50 arranged in the second gap region B, that is, the large gap region, does not substantially support the upper-layer substrate 10 and the lower-layer substrate 20, but plays a good prevention role, and can minimize a possibility that solder bridging occurs between two adjacent solder joints because a longitudinal interval between the upper-layer substrate 10 and the lower-layer substrate 20 is reduced due to fluctuation of a soldering material in an assembly process of the upper-layer substrate 10 and the lower-layer substrate 20.

In another possible implementation, as shown in FIG. 4, in the second gap region B, two ends of the support member 50 respectively abut against the upper-layer substrate 10 and the lower-layer substrate 20. That is, in the second gap region B, the support member 50 is supported between the upper-layer substrate 10 and the lower-layer substrate 20, and is in contact with both the dual-side substrates.

It may be understood that, in this implementation, because the support member 50 in the second gap region B is in contact with both the dual-side substrates, the support member 50 arranged in the second gap region B, that is, the large gap region, can substantially support the upper-layer substrate 10 and the lower-layer substrate 20, so that there is always a proper interval between the upper-layer substrate 10 and the lower-layer substrate 20 when the longitudinal interval between the upper-layer substrate 10 and the lower-layer substrate 20 is reduced due to fluctuation of the soldering material and solder bridging does not easily occur between two adjacent solder joints.

With reference to the foregoing description, it should be understood that the support member 50 arranged in the second gap region B may be in contact with both the dual-side substrates, to substantially support the upper-layer substrate 10 and the lower-layer substrate 20, or may be in contact with only the one-side substrate without supporting the upper-layer substrate 10 and the lower-layer substrate 20. That is, the support member 50 arranged in the second gap region B can prevent fluctuation between batches of soldering incoming materials and a dynamic change of a single material in a soldering process, and is supported between the upper-layer substrate 10 and the lower-layer substrate 20 in a specific case, so that various possible changes in an assembly process of the upper-layer substrate 10 and the lower-layer substrate 20 can be flexibly responded to, practicality is strong, and an application range is wide.

It may be understood that heights of the support members 50 may be the same or may be different. The height of the support member 50 may be understood as a size of the support member 50 in a direction perpendicular to the lower-layer substrate 20, or the height of the support member 50 may be understood as a size of the support member 50 in a direction perpendicular to the upper-layer substrate 10. The height direction of the support member 50 is a direction perpendicular to a plane on which a surface of the lower-layer substrate 20 is located.

Refer to FIG. 2, FIG. 3, FIG. 4, and FIG. 5. In a possible implementation, the height of the support member 50 in the first gap region A is different from the height of the support member 50 in the second gap region B, thereby forming a layout in which the support members 50 have inconsistent heights.

For example, as shown in FIG. 2, FIG. 3, and FIG. 4, the first gap region A is located in the middle, the second gap region B is located at the edge, the heights of the support members 50 in the first gap region A are the same, the heights of the support members 50 in the second gap region B are the same, and the heights of the support members 50 in the first gap region A are less than the heights of the support members 50 in the second gap region B. Alternatively, as shown in FIG. 5, the first gap region A is located at the edge, the second gap region B is located in the middle, the heights of the support members 50 in the first gap region A are the same, heights of the support members 50 in the second gap region B are the same, and the heights of the support members 50 in the second gap region B are greater than the heights of the support members 50 in the first gap region A.

Refer to FIG. 6. In another possible implementation, the height of the support member 50 in the first gap region A is the same as the height of the support member 50 in the second gap region B, to form a layout in which the heights of the support members 50 are consistent. Therefore, each support member 50 is of a same height, so that processing and manufacturing of the support member 50 can be simpler, which helps reduce the material management costs and the production costs of the board-level structure 100.

Therefore, the heights of the support members 50 have diversified possible changes, and selection of an actual height of the support member 50 needs to meet the following requirements: No solder bridging occurs between adjacent solder joints, and an open soldering problem in which no effective solder joint can be formed needs to be avoided. That is, the heights of the support members 50 can be designed based on an actual situation under the foregoing conditions, with strong flexibility and a wide application range.

Based on the foregoing description, it should be understood that, in the layout solution 1, the support members 50 are arranged in both the risk regions, that is, the first gap region A and the second gap region B, in which solder bridging may occur, so that a good prevention function can be achieved, and a possibility of occurrence of solder bridging is further reduced.

Figure 7:
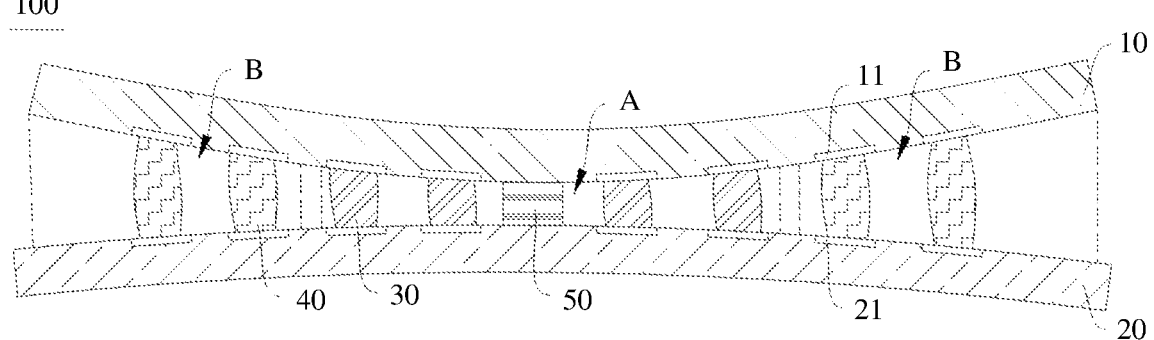
FIG. 7 is an example schematic diagram of a structure of a layout solution 2 of a plurality of support members of a board-level structure according to a first embodiment of this application.
Figure 8:
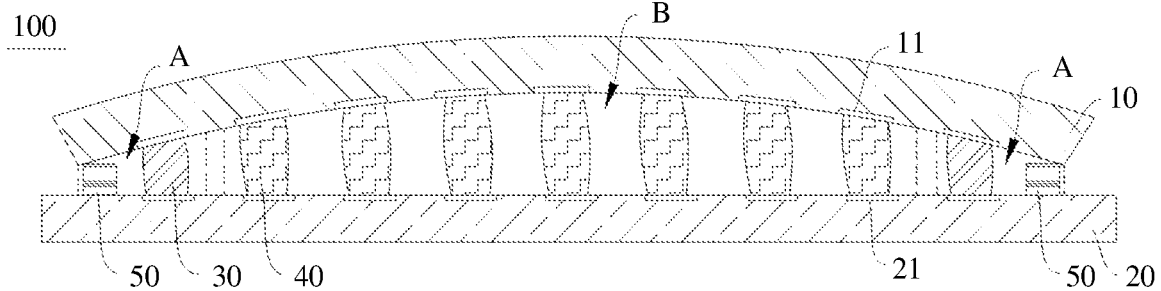
FIG. 8 is another example schematic diagram of a structure of a layout solution 2 of a plurality of support members of a board-level structure according to a first embodiment of this application.
Figure 9:
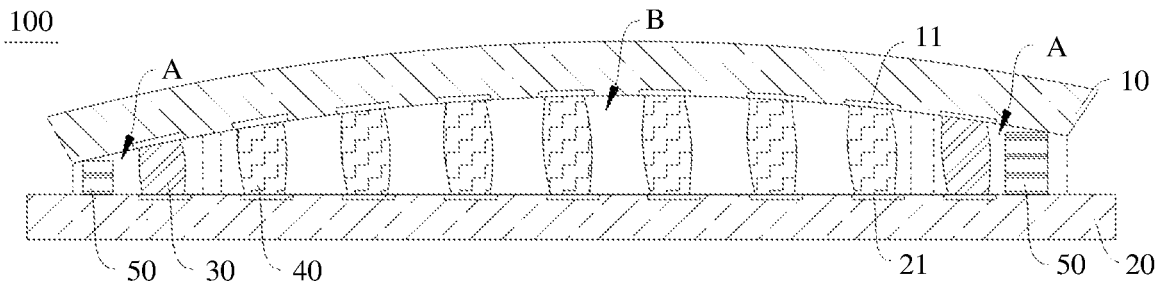
FIG. 9 is still another example schematic diagram of a structure of a layout solution 2 of a plurality of support members of a board-level structure according to a first embodiment of this application.

Refer to FIG. 7, FIG. 8, and FIG. 9. In the layout solution 2, content that is the same as that in the layout solution 1 is not described again. A difference from the layout solution 1 is that the plurality of support members 50 are distributed in the first gap region A at intervals.

It may be understood that the first gap region A is a relatively small gap region, and in the first gap region A, a solder bridging defect may occur on two adjacent solder joints in a normal case. Therefore, the support member 50 is arranged in the first gap region A, so that a specific interval can be always maintained between the upper-layer substrate 10 and the lower-layer substrate 20 through a support function of the support member 50, to effectively minimize a possibility that solder bridging occurs on two adjacent solder joints when a soldering material collapses because deformation of the upper-layer substrate 10 and the lower-layer substrate 20 increases with a change of a temperature in a process of heating and soldering the upper-layer substrate 10 and the lower-layer substrate 20, thereby ensuring reliability of a circuit system of the board-level structure 100.

In this solution, it should be understood that because the plurality of support members 50 do not participate in forming of the solder joint, the support members 50 are spaced apart from the first soldering structures 30, to avoid an adverse impact on the solder joint.

In a possible implementation, as shown in FIG. 8, the heights of the support members 50 in the first gap region A are the same. The height of the support member 50 may be understood as a size of the support member 50 in a direction perpendicular to the lower-layer substrate 20, or may be understood as a size of the support member 50 in a direction perpendicular to the upper-layer substrate 10. That is, a height direction of the support member 50 is a direction perpendicular to a plane on which a surface of the lower-layer substrate 20 is located.

Therefore, the heights of the support members 50 can be the same, so that processing and manufacturing of the support members 50 are more convenient, which helps reduce the material management costs and the production costs of the board-level structure 100.

In another possible implementation, as shown in FIG. 9, the heights of the support members 50 in the first gap region A are different. The height of the support member 50 may be understood as a size of the support member 50 in a direction perpendicular to the lower-layer substrate 20, or may be understood as a size of the support member 50 in a direction perpendicular to the upper-layer substrate 10. That is, a height direction of the support member 50 is a direction perpendicular to a plane on which a surface of the lower-layer substrate 20 is located.

Specifically, gap deformation distribution in the first gap region A, that is, the vertical distance between the upper-layer substrate 10 and the lower-layer substrate 20 in the first gap region A, is different and varies. Therefore, the heights of the support members 50 in the first gap region A may present a layout in which the heights of the support members 50 are inconsistent. That is, in the first gap region A, the height of the support member 50 may be high at a position with a relatively large gap, and the height of the support member 50 may be low at a position with a relatively small gap.

In this way, an acting force at each position on the substrate can precisely match the support member 50 at each position, thereby avoiding a problem that the support member 50 may fail due to excessively inconsistent force applied to the support member 50.

Based on the foregoing description, it should be understood that, in the layout solution 2, the support member 50 is arranged in the risk region, that is, the first gap region A, in which solder bridging may occur, so that the support member 50 can be supported between the upper-layer substrate 10 and the lower-layer substrate 20, and the support member 50 plays a good support role, thereby minimizing the possibility of occurrence of solder bridging.

Figure 10:
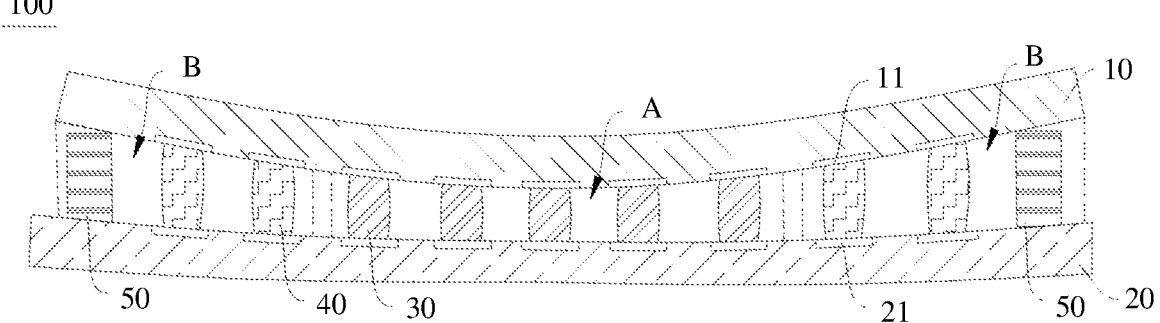
FIG. 10 is an example schematic diagram of a structure of a layout solution 3 of a plurality of support members of a board-level structure according to a first embodiment of this application.

Refer to FIG. 10. In the layout solution 3, content that is the same as that in the layout solution 1 is not described again. A difference from the layout solution 1 is that the plurality of support members 50 are distributed in the second gap region B at intervals.

It may be understood that the second gap region B is a relatively large gap region, and in the second gap region B, the solder bridging defect is not likely to occur on two adjacent solder joints in a normal case. However, considering fluctuation between batches of soldering incoming materials and a dynamic change of a single material in a soldering process, a soldering problem of solder bridging may also be generated between the two adjacent solder joints in a specific case. Therefore, the support member 50 is arranged in the second gap region B, so that a possibility that such a soldering defect occurs can be minimized, and a good prevention effect is achieved.

It should be understood that because the plurality of support members 50 do not participate in forming of the solder joint, the support members 50 are spaced apart from the second soldering structures 40, to avoid an adverse impact on the solder joint.

In this layout solution, for a connection relationship between the plurality of support members 50 arranged in the second gap region B and the upper-layer substrate 10 and the lower-layer substrate 20, refer to the descriptions of the support member 50 arranged in the second gap region B in the layout solution 1. However, it should be noted that the support member 50 arranged in the second gap region B does not need to match gap distribution in the second gap region B, but may be selected based on an actual requirement, provided that no solder bridging occurs between adjacent solder joints in the second gap region B, and an open soldering problem that no effective solder joint can be formed can also be avoided.

In a possible implementation, as shown in FIG. 10, the heights of the support members 50 are the same. The height of the support member 50 may be understood as a size of the support member 50 in a direction perpendicular to the lower-layer substrate 20, or may be understood as a size of the support member 50 in a direction perpendicular to the upper-layer substrate 10. That is, a height direction of the support member 50 is a direction perpendicular to a plane on which a surface of the lower-layer substrate 20 is located.

Therefore, the heights of the support members 50 can be consistent, so that processing and manufacturing of the support members 50 are more convenient, which helps reduce the material management costs and the production costs of the board-level structure 100.

Based on the foregoing description, it should be understood that, in the layout solution 3, the support members 50 are arranged in the risk region, that is, the second gap region B, in which solder bridging may occur, so that a good prevention function can be achieved, and a possibility of occurrence of solder bridging is further reduced.

With reference to the foregoing three layout solutions, a layout design of the plurality of support members 50 can resolve the solder bridging problem during board-level assembly of the upper-layer substrate 10 and the lower-layer substrate 20 to the maximum extent, and the height and the structure design of the support member 50 can further effectively avoid the open soldering problem. That is, the layout design of the plurality of support members 50 can resolve the solder bridging defect and minimize the possibility of occurrence of the open soldering defect.

In this embodiment of this application, the first soldering structure 30 may be understood as a solder joint that is located in the first gap region A and that is jointly formed by heating and soldering a soldering material disposed on the upper-layer substrate 10 and a soldering material disposed on the lower-layer substrate 20 that correspond to each other. The second soldering structure 40 may be understood as a solder joint that is located in the second gap region B and that is formed by heating and soldering a soldering material disposed on the upper-layer substrate 10 and a soldering material disposed on the lower-layer substrate 20 that correspond to each other. Alternatively, the second soldering structure 40 may be understood as a solder joint that is located in the second gap region B and that is formed by heating and soldering a soldering material disposed on the upper-layer substrate 10 in the second gap region B.

In other words, in an actual assembly process of the board-level structure 100, the upper-layer substrate 10 in the package structure 60 is in contact with the lower-layer substrate 20, and the plurality of first soldering structures 30 and the plurality of second soldering structures 40 are formed between the upper-layer substrate 10 and the lower-layer substrate 20 through heating, so that the package structure 60 in the package form is soldered on the lower-layer substrate 20, to connect the package structure 60 and the lower-layer substrate 20.

Specifically, the first soldering structure 30 may include only a first solder ball 31, or may include a first solder ball 31 and a first solder structure 32. The second soldering structure 40 may include a second solder ball 41 and a second solder structure 42. The following describes in detail structures of the first soldering structure 30 and the second soldering structure 40.

To facilitate description of the technical solutions of embodiments of this application, the following describes an assembly phase of the package structure 60 and the lower-layer substrate 20, that is, describes a PCB assembly phase of the package structure 60. A structure form of the PCB assembly of the package structure 60 may be defined as a connection assembly 70 used for the board-level structure 100. A structure form of the connection assembly 70 may be understood as an assembly form of the package structure 60 and the lower-layer substrate 20 before heating and soldering, that is, an assembly form of the upper-layer substrate 10 and the lower-layer substrate 20.

In this embodiment of this application, an example in which the package structure 60 is a package structure 60 packaged in a BGA form is used for description. It may be understood that, the BGA may be understood as a type of surface-mount package used for a multi-pin Large-scale integrated circuit (LSI) and used to manufacture a spherical contact as an outlet pin on a back side of the upper-layer substrate 10 in an array manner and assemble an element such as the chip 61 on a front side of the upper-layer substrate 10.

Refer to FIG. 11 again. The package structure 60 includes the upper-layer substrate 10, the chip 61, and a heat dissipating lid 62. The chip 61 and another electronic element may be mounted on a front side of the upper-layer substrate 10, and a back side of the upper-layer substrate 10 may be electrically connected to the lower-layer substrate 20. The chip 61 is mounted on the front side of the upper-layer substrate 10, and the heat dissipating lid 62 is connected to the front side of the upper-layer substrate 10 and covers a periphery of the chip 61, and can protect the chip 61 and dissipate heat for the chip 61. In other words, the chip 61 may be packaged on one side of the upper-layer substrate 10 through the heat dissipating lid 62. For example, the upper-layer substrate 10 may be a metal substrate, a ceramic substrate, or a PCB board.

Figure 11:
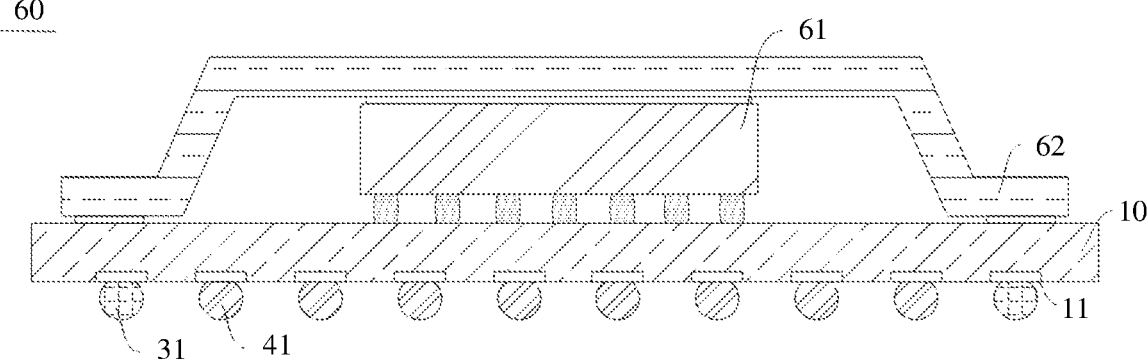
FIG. 11 is an example schematic diagram of a structure of a package structure of a board-level structure according to a first embodiment of this application.
Figure 12:
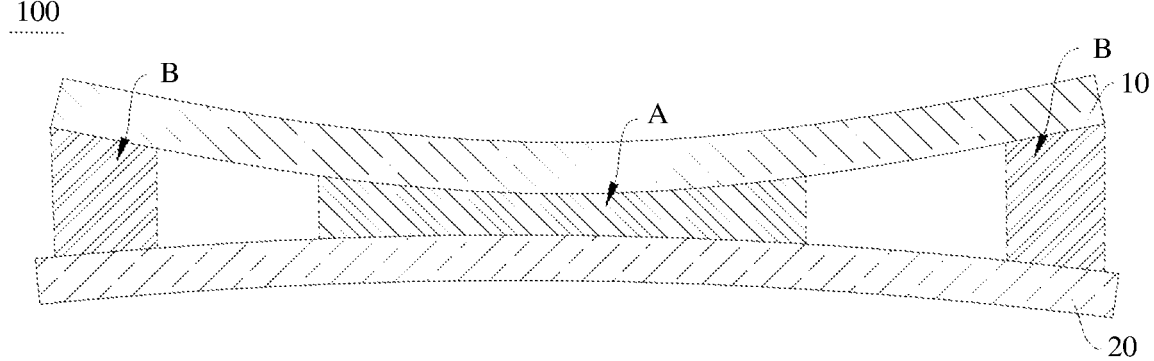
FIG. 12 is an example schematic diagram of a structure of gap distribution of a board-level structure according to a first embodiment of this application.
Figure 13:
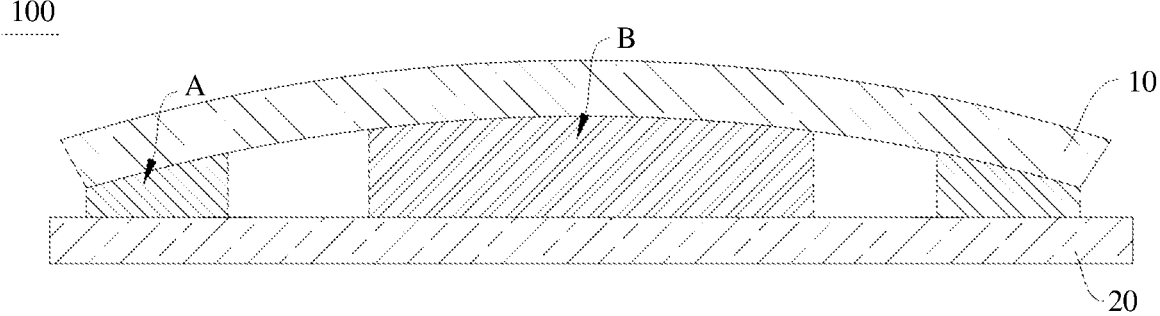
FIG. 13 is another example schematic diagram of a structure of gap distribution of a board-level structure according to a first embodiment of this application.
Figure 14:
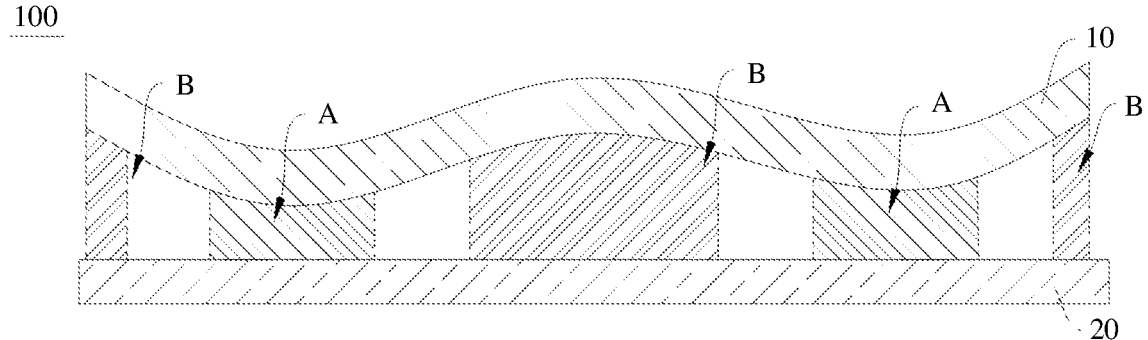
FIG. 14 is still another example schematic diagram of a structure of gap distribution of a board-level structure according to a first embodiment of this application.
Figure 15:
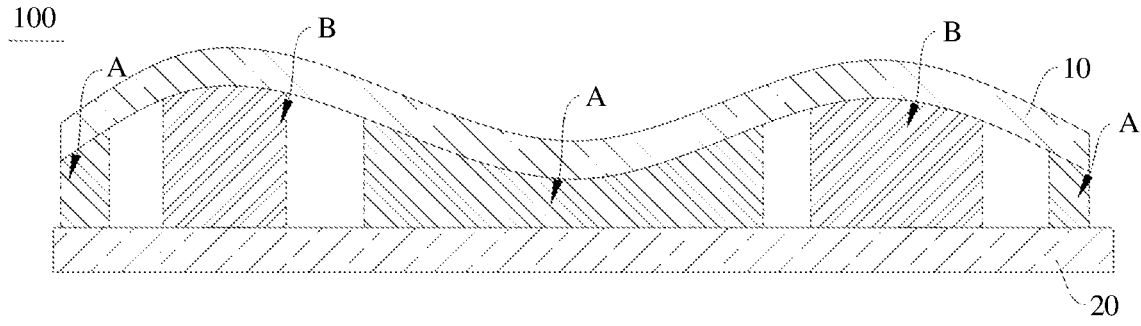
FIG. 15 is still another example schematic diagram of a structure of gap distribution of a board-level structure according to a first embodiment of this application.

It should be noted that FIG. 11 is merely intended to schematically describe a connection relationship among the upper-layer substrate 10, the chip 61, and the heat dissipating lid 62, but is not intended to specifically limit connection locations, specific configurations, or quantities of the devices. The structure shown in this embodiment of this application does not constitute a specific limitation on the package structure 60. In some other embodiments of this application, the package structure 60 may include more or fewer components than those shown in the figure, or some components may be combined, or some components may be split, or different component arrangements may be used. The components shown in the figure may be implemented by using hardware, software, or a combination of software and hardware.

Figure 16:
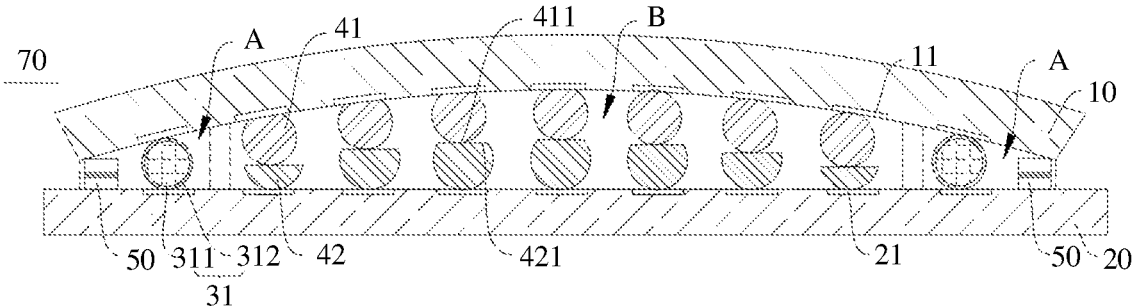
FIG. 16 is an example schematic diagram of a structure of a connection assembly used for a board-level structure according to a first embodiment of this application.
Figure 17:
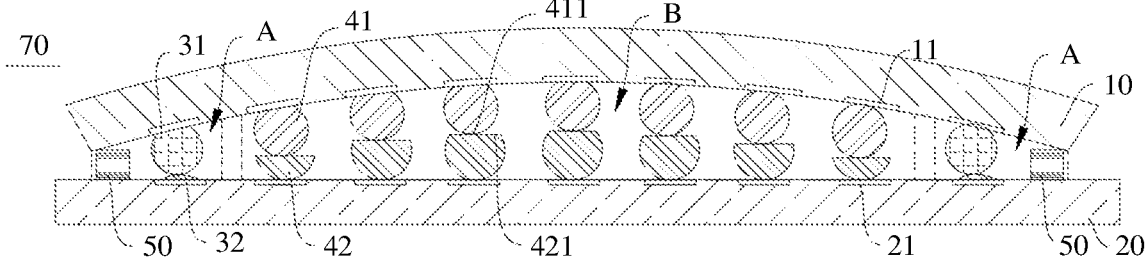
FIG. 17 is another example schematic diagram of a structure of a connection assembly used for a board-level structure according to a first embodiment of this application.

Refer to FIG. 11, FIG. 16, and FIG. 17. A plurality of upper-layer pads 11 are disposed on the back side of the upper-layer substrate 10, the plurality of upper-layer pads 11 are distributed at intervals, and each upper-layer pad 11 may be provided with one first solder ball 31 or one second solder ball 41.

It may be understood that the first solder ball 31 or the second solder ball 41 is the foregoing spherical contact that can be used as an outlet pin. The first solder ball 31 may be understood as a spherical contact distributed in the first gap region A when the upper-layer substrate 10 and the lower-layer substrate 20 are assembled, that is, a soldering material that can form the first soldering structure 30. The second solder ball 41 may be understood as a spherical contact distributed in the second gap region B when the upper-layer substrate 10 and the lower-layer substrate 20 are assembled, that is, a soldering material that can form the second soldering structure 40.

That is, the upper-layer substrate 10 is provided with a plurality of first solder balls 31 distributed in the first gap region A and a plurality of second solder balls 41 distributed in the second gap region B.

A plurality of lower-layer pads 21 are disposed on the front side of the lower-layer substrate 20. The plurality of lower-layer pads 21 are distributed at intervals and are disposed in a one-to-one correspondence with the plurality of upper-layer pads 11. Each lower-layer pad 21 is provided with one first solder structure 32 or one second solder structure 42, or no conductive structure is disposed on each lower-layer pad 21.

It may be understood that the first solder structure 32 may be understood as a structure distributed in the first gap region A when the upper-layer substrate 10 and the lower-layer substrate 20 are assembled, that is, a soldering material that can form the first soldering structure 30. A case in which no conductive structure is disposed may be understood as that when the upper-layer substrate 10 and the lower-layer substrate 20 are assembled, no conductive structure is disposed on the lower-layer pad 21 distributed in the first gap region A. The second solder structure 42 may be understood as a structure distributed in the second gap region B when the upper-layer substrate 10 and the lower-layer substrate 20 are assembled, that is, a soldering material that can form the second soldering structure 40.

That is, the lower-layer substrate 20 is provided with a plurality of first solder structures 32 distributed in the first gap region A and a plurality of second solder structures 42 distributed in the second gap region B. Alternatively, the lower-layer substrate 20 is provided with a plurality of second solder structures 42 distributed in the second gap region B.

The following separately describes an assembly possibility of forming the first soldering structure 30 in the first gap region A and an assembly possibility of forming the second soldering structure 40 in the second gap region B.

The assembly possibility of forming the first soldering structure 30 in the first gap region A includes at least the following two assembly solutions.

Assembly solution 1 of the first soldering structure 30: The first soldering structure 30 is formed depending on only the first solder ball 31.

Assembly solution 2 of the first soldering structure 30: The first solder ball 31 and the first solder structure 32 jointly form the first soldering structure 30.

The following describes in detail the two assembly solutions of the first soldering structure 30.

Referring to FIG. 16 and FIG. 17. In the assembly solution 1 of the first soldering structure 30, the upper-layer substrate 10 is electrically connected to the lower-layer substrate 20 through the plurality of first solder balls 31. That is, in a process of heating and soldering the upper-layer substrate 10 and the lower-layer substrate 20, the first solder ball 31 may directly form the first soldering structure 30.

Under this setting, a tin amount for forming the first soldering structure 30 in a soldering process is formed by only the first solder ball 31 of the upper-layer substrate 10, that is, all soldering materials required for forming a solder joint are integrated on the first solder ball 31 of the upper-layer substrate 10. Therefore, no solder paste needs to be brushed on the lower-layer pad 21, which helps better control the tin amount in the small gap region and avoid a soldering defect of solder bridging in the first gap region A.

Refer to FIG. 16. The first solder ball 31 includes a solder ball body 311 and a solder flux layer 312, and the solder flux layer 312 covers at least a part of an outer surface of the solder ball body 311. For example, the solder flux layer 312 covers a part of the outer surface of the solder ball body 311. Alternatively, the solder flux layer 312 completely covers the outer surface of the solder ball body 311.

It may be understood that, the solder flux layer 312 is disposed on the outer surface of the solder ball body 311, so that a soldering process can be facilitated and promoted in a soldering process by using a functional function of a solder flux, and the solder flux layer also has a protective function, and can prevent an oxidation reaction. This structure enables the first soldering structure 30 to have a small tin amount, which is helpful to further avoid occurrence of the soldering defect of solder bridging.

It should be noted that, in a same process step of forming the solder flux layer 312, the solder flux layer 312 may also be formed on an outer surface of the second solder ball 41, to facilitate a soldering process of the second soldering structure 40. However, in another embodiment of this application, instead of disposing the solder flux layer 312 outside the solder ball body 311, a paste flux may be point-coated to a corresponding lower-layer pad 21, or the solder flux layer 312 is disposed outside the solder ball body 311, and a paste flux is also point-coated to a corresponding lower-layer pad 21. It should be understood that the foregoing solutions and an implementation form of a combination thereof still fall within the protection scope of the technical solutions of this application, and this is not strictly limited herein.

Figure 18:
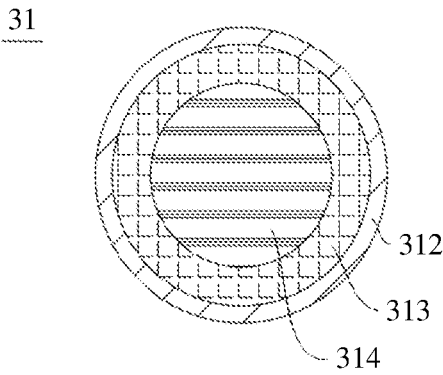
FIG. 18 is an example schematic diagram of a structure of a first solder ball of a connection assembly used for a board-level structure according to a first embodiment of this application.

Refer to FIG. 18. In a possible implementation, the solder ball body 311 includes a core layer 314 and a tin layer 313 wrapping an outer surface of the core layer 314, and at least a part of the tin layer 313 is connected to the solder flux layer 312. In other words, the solder flux layer 312, the tin layer 313, and the core layer 314 are disposed sequentially in a radial direction of the solder ball body 311.

For example, the core layer 314 may be a spherical core with a high melting point that does not melt in a heating and soldering process. That is, a melting point of the core layer 314 is higher than a melting point of the tin layer 313, and the core layer 314 is a spherical support structure. The tin layer 313 may be slightly thicker than conventional thin tin. On the one hand, it is ensured that the core layer 314 is completely wrapped by the tin layer 313, and on the other hand, because the tin layer 313 is an important part of the solder joint (the first soldering structure 30), a sufficient tin amount needs to be reserved to minimize a possibility of occurrence of a soldering defect in which no effective solder joint can be formed. Therefore, the first solder ball 31 may present a form in which "the spherical core is wrapped by soldering tin" as a whole. For example, the spherical core may be a metal ball.

It should be noted that, in this implementation, because the solder ball body 311 includes the core layer 314, a size of the core layer 314 may be less than a size of a conventional solder ball, to ensure that a size of the entire first solder ball 31 is equal to the size of the conventional solder ball or is slightly greater than the size of the conventional solder ball. In addition, a structure design in which "the spherical core is wrapped by soldering tin" may not be limited to being applied to only the first solder ball 31 in the first gap region A, and may also be applied to the second solder ball 41 in the second gap region B together or separately. In other words, that "the spherical core is wrapped by soldering tin" may be partially arranged at an outlet position of the upper-layer substrate 10, or may be entirely arranged at an outlet position of the upper-layer substrate 10, which may be selected based on an actual situation. This is not strictly limited in embodiments of this application.

In another possible implementation, a structure of the solder ball body 311 is the same as that of the conventional solder ball. That is, there is no support structure inside the solder ball body 311, and the solder ball body 311 is made of soldering tin.

Refer to FIG. 17. In the assembly solution 2 of the first soldering structure 30, the plurality of first solder balls 31 are connected to the plurality of first solder structures 32 in a one-to-one correspondence. That is, in a process of heating and soldering the upper-layer substrate 10 and the lower-layer substrate 20, the first solder ball 31 and the first solder structure 32 jointly form the first soldering structure 30. For example, a material of the first solder structure 32 includes a solder paste having 50% alloy. Alternatively, a material of the first solder structure 32 includes a paste flux.

Under this setting, a tin amount for forming the first soldering structure 30 in the soldering process may be jointly formed by the first solder ball 31 of the upper-layer substrate 10 and the first solder structure 32 of the lower-layer substrate 20. Therefore, the control of the tin amount of the first soldering structure 30 can be adjusted bidirectionally, which facilitates better control of the tin amount in the small gap region and avoids occurrence of the soldering defect of solder bridging in the first gap region A.

Figure 19:
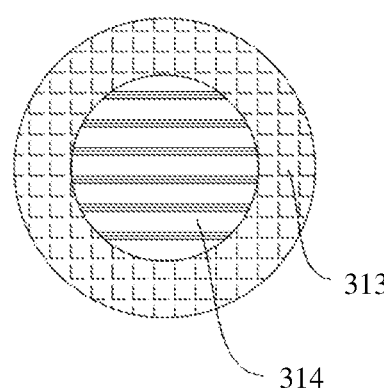
FIG. 19 is another example schematic diagram of a structure of a first solder ball of a connection assembly used for a board-level structure according to a first embodiment of this application.

Refer to FIG. 19. In a possible implementation, the first solder ball 31 includes a core layer 314 and a tin layer 313 wrapping an outer surface of the core layer 314. In other words, the tin layer 313 and the core layer 314 are disposed sequentially in a radial direction of the first solder ball 31. It should be understood that, different from the assembly solution 1 of the first soldering structure 30, because the first soldering structure 30 in this assembly solution may be formed by both the first solder ball 31 and the first solder structure 32, and the first solder structure 32 has a specific solder flux, the solder flux layer 312 may not be disposed on the first solder ball 31.

For example, the core layer 314 may be a spherical core with a high melting point that does not melt in a heating and soldering process. The tin layer 313 may be slightly thicker than conventional thin tin. On the one hand, it is ensured that the core layer 314 is completely wrapped by the tin layer 313, and on the other hand, because the tin layer 313 is an important part of the solder joint (the first soldering structure 30), a sufficient tin amount needs to be reserved to minimize a possibility of occurrence of a soldering defect in which no effective solder joint can be formed. Therefore, the first solder ball 31 may present a form in which "the spherical core is wrapped by soldering tin" as a whole.

It should be noted that, in this implementation, because the first solder ball 31 includes the core layer 314, a size of the core layer 314 may be less than a size of a conventional solder ball, to ensure that a size of the entire first solder ball 31 is equal to the size of the conventional solder ball or is slightly greater than the size of the conventional solder ball. In addition, a structure design in which "the spherical core is wrapped by soldering tin" may not be limited to being applied to only the first solder ball 31 in the first gap region A, and may also be applied to the second solder ball 41 in the second gap region B together or separately. In other words, that "the spherical core is wrapped by soldering tin" may be partially arranged at an outlet position of the upper-layer substrate 10, or may be entirely arranged at an outlet position of the upper-layer substrate 10, which may be selected based on an actual situation. This is not strictly limited in embodiments of this application.

In another possible implementation, a structure of the first solder ball 31 is the same as that of the conventional solder ball. That is, there is no support structure inside the first solder ball 31, and the solder ball body 311 is made of soldering tin.

Based on the foregoing description, it should be understood that, when the upper-layer substrate 10 and the lower-layer substrate 20 are heated and soldered to form the board-level structure 100, the first solder ball 31 and the first solder structure 32 may jointly form the first soldering structure 30. Alternatively, only the first solder ball 31 may form the first soldering structure 30, which may be selected based on an actual situation. This is not strictly limited in embodiments of this application.

The foregoing describes the assembly possibility of forming the first soldering structure 30 in the first gap region A, and the following describes the assembly possibility of forming the second soldering structure 40 in the second gap region B.

Figure 20:
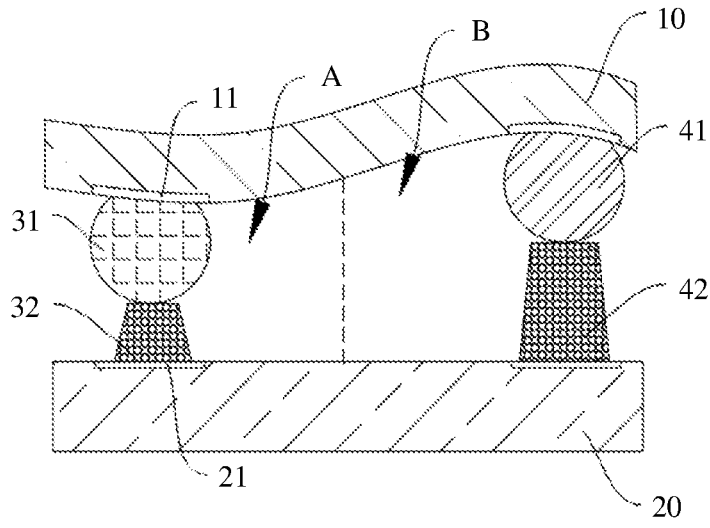
FIG. 20 is an example schematic diagram of a partial structure of a connection assembly used for a board-level structure according to a first embodiment of this application.

Refer to FIG. 16, FIG. 17, and FIG. 20. The assembly possibility of forming the second soldering structure 40 in the second gap region B includes at least the following three assembly solutions.

Assembly solution 1 of the second soldering structure 40: The second solder ball 41 and the second solder structure 42 jointly form the second soldering structure 40, where a material of the second solder structure 42 includes prefabricated tin having a 100% alloy.

Assembly solution 2 of the second soldering structure 40: The second solder ball 41 and the second solder structure 42 jointly form the second soldering structure 40, where a material of the second solder structure 42 includes a solder paste having 50% alloy.

Assembly solution 3 of the second soldering structure 40: The second solder ball 41 and the second solder structure 42 jointly form the second soldering structure 40, where a material of the second solder structure 42 includes prefabricated tin having a 100% alloy and a solder paste having 50% alloy.

The following specifically describes the three assembly solutions of the second soldering structure 40.

Refer to FIG. 16 and FIG. 17. In the assembly solution 1 of the second soldering structure 40, the plurality of second solder balls 41 are connected to the plurality of second solder structures 42 in a one-to-one correspondence, and the material of the second solder structure 42 includes the prefabricated tin having the 100% alloy. That is, in a process of heating and soldering the upper-layer substrate 10 and the lower-layer substrate 20, the second solder ball 41 and the second solder structure 42 jointly form the second soldering structure 40.

It may be understood that the prefabricated tin has the 100% alloy, and a tin amount of the prefabricated tin is 50% different from that of the solder paste having the 50% alloy under a same volume. When a tin amount in the large gap region (the second gap region B) is insufficient, if the tin amount is increased by increasing the solder paste, a solder bridging problem may be caused. The prefabricated tin can meet a tin amount requirement in the large gap region to the maximum extent, and can further avoid an open soldering defect that is easily generated in the large gap region.

In a possible implementation, as shown in FIG. 16 and FIG. 17, heights of the second solder structures 42 are different, and the height of the second solder structure 42 is a size of the second solder structure 42 in a direction perpendicular to the lower-layer substrate 20. That is, a height direction of the second solder structure 42 is a direction perpendicular to a plane on which a surface of the lower-layer substrate 20 is located.

It may be understood that a tin amount for forming the second soldering structure 40 in the soldering process may be jointly formed by the second solder ball 41 of the upper-layer substrate 10 and the second solder structure 42 of the lower-layer substrate 20. That is, the control of the tin amount of the second soldering structure 40 may be adjusted bidirectionally by controlling a tin amount of the second solder ball 41, or by controlling a tin amount of the second solder structure 42, or by controlling a tin amount of the second solder ball 41 and a tin amount of the second solder structure 42. In addition, the inconsistent heights of the second solder structures 42 help better control the tin amount and match deformed gap distribution in the large gap region (the second gap region B), to avoid the soldering defect of open soldering in the first gap region A.

Figure 21:
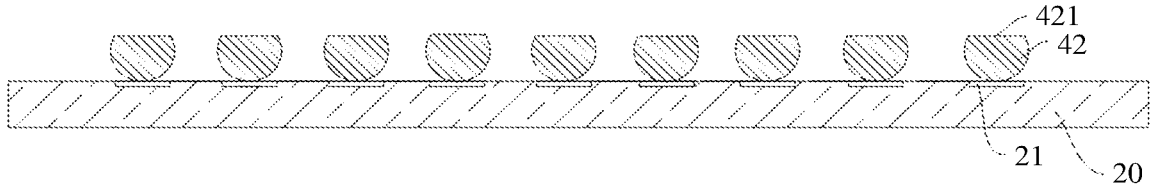
FIG. 21 is an example schematic diagram of a structure of a first implementation of an assembly solution 1 of a first soldering structure according to a first embodiment of this application.

In a possible implementation, as shown in FIG. 21, heights of the second solder structures 42 are the same, and the height of the second solder structure 42 is a size of the second solder structure 42 in a direction perpendicular to the lower-layer substrate 20. That is, a height direction of the second solder structure 42 is a direction perpendicular to a plane on which a surface of the lower-layer substrate 20 is located.

Based on the foregoing description, it should be understood that the height of the second solder structure 42 can be flexibly adjusted based on an actual situation, to accurately match a tin amount in a deformed region, and minimize a possibility of occurrence of a soldering defect.

In a first implementation of this solution, each second solder structure 42 is a prefabricated solder ball made of the prefabricated tin. That is, in the second gap region B, the plurality of prefabricated solder balls are arranged at intervals. For example, the prefabricated solder ball may be connected to the lower-layer pad 21 in a ball mounting manner.

Refer to FIG. 16, FIG. 17, and FIG. 21. A surface 421 that is of each prefabricated solder ball and that is in contact with a corresponding second solder ball 41 is a plane. It should be noted that, a case in which the surface 421 that is of the prefabricated solder ball and that is in contact with the second solder ball 41 is the plane may include a case in which the surface 421 that is of the prefabricated solder ball and that is in contact with the second solder ball 41 is not arc-shaped, or may include a case in which the surface 421 that is of the prefabricated solder ball and that is in contact with the second solder ball 41 is an approximate plane with a tiny arc surface. It should be understood that, the plane is a surface form that allows the second solder ball 41 to be placed on the prefabricated solder ball without sliding between the second solder ball and the prefabricated solder ball, so that a subsequent soldering process can be performed more smoothly.

It may be understood that because the second solder ball 41 is spherical, a surface 411 that is of the second solder ball 41 and that is in contact with the prefabricated solder ball is an arc surface. In addition, if the surface 421 that is of the prefabricated solder ball and that is in contact with the second solder ball 41 is also an arc surface, contact between the two arc surfaces causes relative sliding between the prefabricated solder ball and the second solder ball, and consequently, misalignment may occur between the upper-layer substrate 10 and the lower-layer substrate 20 in the assembly process, affecting electrical reliability of the board-level structure 100. Therefore, the surface 421 that is of the prefabricated solder ball and that is in contact with the second solder ball 41 is set to the plane, so that a possibility of occurrence of such a problem can be fully avoided, and reliability is good.

Figure 22:
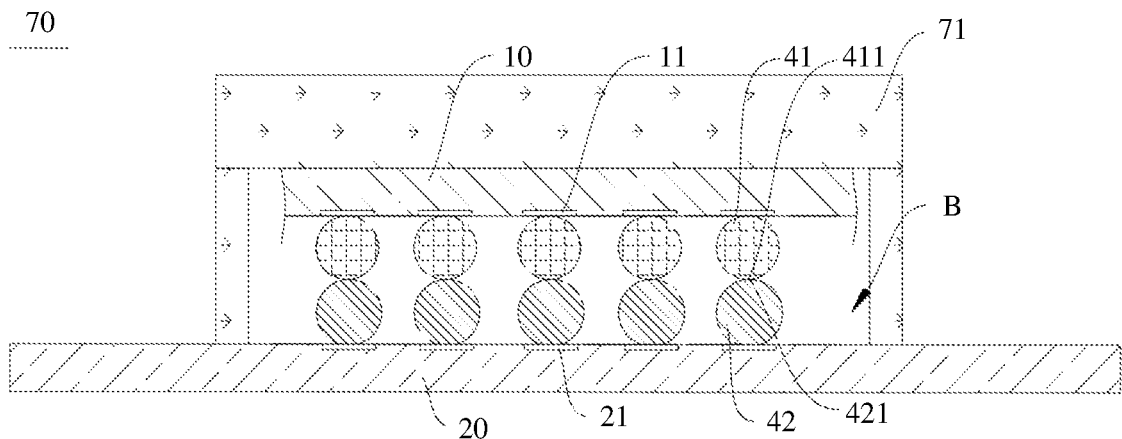
FIG. 22 is an example schematic diagram of a structure of a second implementation of an assembly solution 1 of a first soldering structure according to a first embodiment of this application.

Refer to FIG. 22. In a second implementation of this solution, a difference from the first implementation is that the surface 421 that is of the prefabricated solder ball and that is in contact with the second solder ball 41 is the arc surface. The connection assembly 70 further includes a limiting apparatus 71, and the limiting apparatus 71 is configured to limit relative sliding between the prefabricated solder ball and the second solder ball 41. For example, the limiting apparatus 71 may be located on a periphery of the upper-layer substrate 10 and abuts against the lower-layer substrate 20.

It may be understood that because both the outer surfaces 411 and 421 of the second solder ball 41 and the prefabricated solder ball are the arc surfaces, to avoid the upper-layer substrate 10 from sliding off the lower-layer substrate 20 due to contact between the two arc surfaces, the limiting apparatus 71 is additionally disposed to limit relative sliding between the upper-layer substrate 10 and the lower-layer substrate 20, thereby improving alignment stability between the upper-layer substrate 10 and the lower-layer substrate 20.

Figure 23:
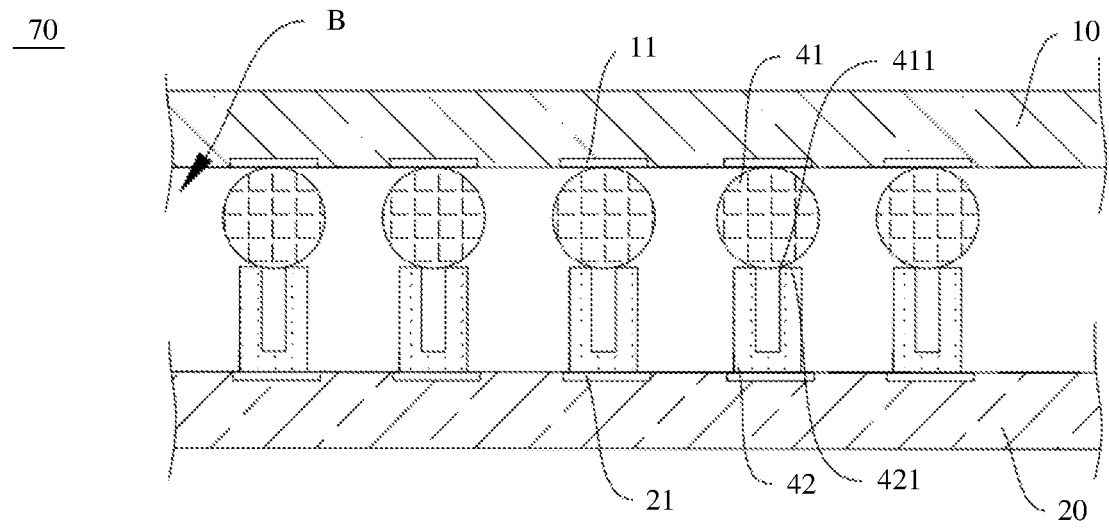
FIG. 23 is an example schematic diagram of a structure of a third implementation of an assembly solution 1 of a first soldering structure according to a first embodiment of this application.

Refer to FIG. 23. In a third implementation of this solution, a difference from the first implementation is that each second solder structure 42 is a prefabricated solder sheet made of the prefabricated tin, and the surface 421 that is of the prefabricated solder sheet and that is in contact with the second solder ball 41 is the plane. It may be understood that different from the prefabricated solder ball in the first implementation, the prefabricated solder sheet not only has a function of adjusting a tin amount, but also has a support function. The prefabricated solder sheet can prevent the second solder ball 41 from sliding on the lower-layer substrate 20, and has good stability.

For example, the prefabricated solder sheet may be in a "U" shape, or the prefabricated solder sheet may be in a column shape. It should be noted that a shape of the prefabricated solder sheet is not limited to the foregoing two shapes, and a shape having stable support performance is applicable. This is not strictly limited in embodiments of this application.

Figure 24:
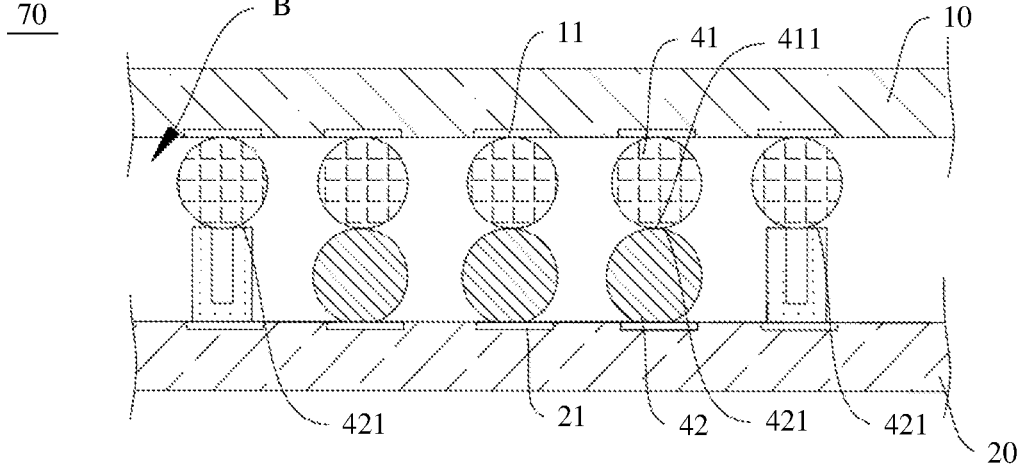
FIG. 24 is an example schematic diagram of a structure of a fourth implementation of an assembly solution 1 of a first soldering structure according to a first embodiment of this application.

Refer to FIG. 24. In a fourth implementation of this solution, a difference from the first implementation is that some second solder structures 42 are prefabricated solder balls made of the prefabricated tin, and the surface 421 that is of the prefabricated solder ball and that is in contact with the second solder ball 41 is the arc surface. Some other second solder structures 42 are prefabricated solder sheets made of the prefabricated tin, and the surface 421 that is of the prefabricated solder sheet and that is in contact with the second solder ball 41 is the plane. For example, the prefabricated solder sheet may be located at a periphery of the prefabricated solder ball. However, it should be understood that this is not limited thereto.

It may be understood that, different from the first implementation in which all the second solder structures 42 are set to the prefabricated solder balls, in this implementation, some second solder structures 42 are set to the prefabricated solder balls, and some other second solder structures 42 are set to the prefabricated solder sheets, so that some prefabricated solder balls can be kept in an arc shape on outer surfaces without performing process processing, thereby reducing material management costs and production costs during assembly of the board-level structure 100, and helping improve production efficiency.

Figure 25:
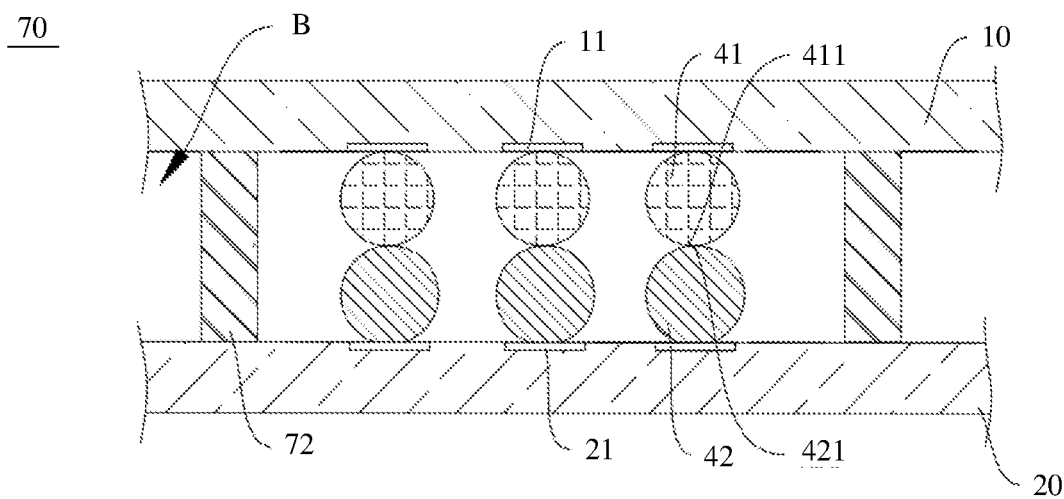
FIG. 25 is an example schematic diagram of a structure of a fifth implementation of an assembly solution 1 of a first soldering structure according to a first embodiment of this application.

Refer to FIG. 25. In a fifth implementation of this solution, a difference from the first implementation is that the surface 421 that is of the prefabricated solder ball and that is in contact with the second solder ball 41 is the arc surface. The connection assembly 70 further includes a collapsible structural member 72. The collapsible structural member 72 is located in the second gap region B, and is supported between the upper-layer substrate 10 and the lower-layer substrate 20. The collapsible structural member 72 can be melted when the connection assembly 70 is heated and soldered.

For example, there are two collapsible structural members 72, and the two collapsible structural members 72 are respectively supported on two sides of the second gap region B. In addition, the collapsible structural member 72 may be a soldering tin material that can be melt and collapse in a heating and soldering process, and can be supported between the upper-layer substrate 10 and the lower-layer substrate 20 before the heating and soldering.

It may be understood that because both the outer surfaces 411 and 421 of the second solder ball 41 and the prefabricated solder ball are the arc surfaces, to avoid the upper-layer substrate 10 from sliding off the lower-layer substrate 20 due to contact between the two arc surfaces, the collapsible structural member 72 is additionally disposed to limit relative sliding between the upper-layer substrate 10 and the lower-layer substrate 20, thereby improving alignment stability between the upper-layer substrate 10 and the lower-layer substrate 20.

It should be noted that the collapsible structural member 72 is spaced apart from the second solder ball 41 and the second solder structure 42 that form the second soldering structure 40, so as not to affect formation of the solder joint. A shape of a pad connected to the collapsible structural member needs to adapt to the collapsible structural member, and the collapsible structural member only needs to be supported between the upper-layer substrate 10 and the lower-layer substrate 20. A quantity, a shape, and a connection position of the collapsible structural member are not strictly limited.

Figure 26:
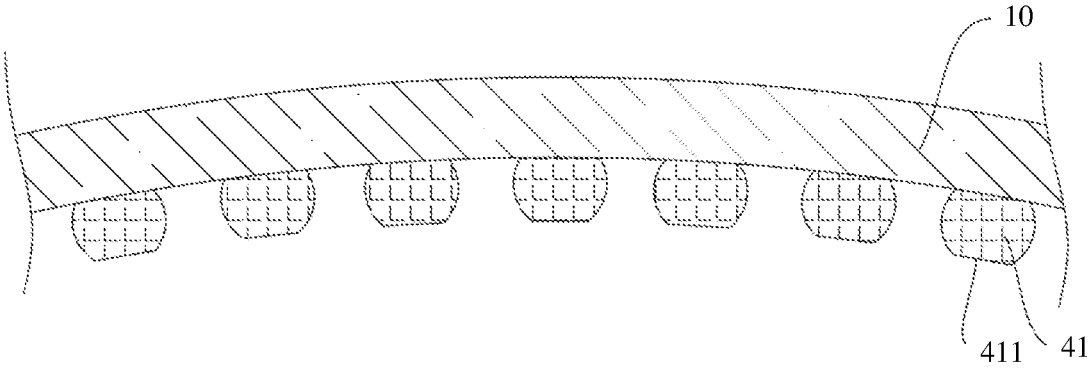
FIG. 26 is an example schematic diagram of a structure of a sixth implementation of an assembly solution 1 of a first soldering structure according to the first embodiment of this application.

Refer to FIG. 26. In a sixth implementation of this solution, a difference from the first implementation is that the surface 421 that is of each prefabricated solder ball and that is in contact with a corresponding second solder ball 41 is the arc surface, and surfaces 411 that are of at least some second solder balls 41 and that are in contact with corresponding prefabricated solder balls are planes. That is, the second solder structure 42 on a side of the lower-layer substrate 20 may present a form in which the outer surface without process processing is an arc surface, and a surface that is of the second solder ball 41 on the upper-layer substrate 10 and that is in contact with the second solder structure 42 needs to present a form in which at least some surfaces with process processing are planes. It should be understood that the surfaces 411 that are of all the second solder balls 41 and that are in contact with the second solder structures 42 are set to the planes, or the surfaces 411 that are of some second solder balls 41 and that are in contact with the second solder structures 42 are set to the planes.

It should be noted that, a case in which the surface 411 that is of the second solder ball 41 and that is in contact with the prefabricated solder ball is the plane may include a case in which the surface 411 that is of the second solder ball 41 and that is in contact with the prefabricated solder ball is not arc-shaped, or may include a case in which the surface 411 that is of the second solder ball 41 and that is in contact with the prefabricated solder ball is an approximate plane with a tiny arc surface. It should be understood that, the plane is a surface form that allows the second solder ball 41 to be placed on the prefabricated solder ball without sliding between the second solder ball and the prefabricated solder ball, so that a subsequent soldering process can be performed more smoothly.

It may be understood that because the prefabricated solder ball is spherical, the surface 421 that is of the prefabricated solder ball and that is in contact with the second solder ball 41 is the arc surface. In addition, if the surface 411 that is of the second solder ball 41 and that is in contact with the prefabricated solder ball is also an arc surface, contact between the two arc surfaces causes relative sliding between the prefabricated solder ball and the second solder ball, and consequently, misalignment may occur between the upper-layer substrate 10 and the lower-layer substrate 20 in the assembly process, affecting electrical reliability of the board-level structure 100. Therefore, the surface 411 that is of the second solder ball 41 and that is in contact with the prefabricated solder ball is set to the plane, so that a possibility of occurrence of such a problem can be fully avoided.

Based on the foregoing six possible implementations, it should be understood that, for an implementation that ensures contact stability between the second solder ball 41 and the second solder structure 42, a corresponding structure design may be performed on only the second solder ball 41, so that an outer surface of each second solder structure 42 is an arc surface, and surfaces that are of at least some second solder balls 41 and that are in contact with the second solder structures 42 are planes. Alternatively, a corresponding structure design may be performed on only the second solder structure 42, so that a surface that is of each second solder ball 41 and that is in contact with the second solder structure 42 is an arc surface, and surfaces that are of at least some second solder structures 42 and that are in contact with the second solder balls 41 are planes. Alternatively, no corresponding structure design may be performed on the second solder ball 41 or the second solder structure 42, but a structural member that can ensure smooth contact between the second solder ball 41 and the second solder structure 42 is additionally disposed. Implementations are flexible and diversified, and may be designed based on an actual situation. This is not strictly limited in embodiments of this application.

Refer to FIG. 20. In the assembly solution 2 of the second soldering structure 40, content that is the same as that in the assembly solution 1 is not described again. A difference from the assembly solution 1 is that the second solder structure 42 includes the solder paste having the 50% alloy.

In a possible implementation, a tin amount of the solder paste may be controlled in a tin spraying manner, to adapt to the deformed gap distribution in the second gap region B. For example, a tin amount of the second solder structure 42 may be greater than the tin amount of the first solder structure 32, to adapt to a difference between a gap of the first gap region A and a gap of the second gap region B.

Based on the foregoing description, it should be understood that, when the upper-layer substrate 10 and the lower-layer substrate 20 are heated and soldered to form the board-level structure 100, the second solder ball 41 and the second solder structure 42 may jointly form the second soldering structure 40. The implementation of assembly stability of the second solder ball 41 and the second solder structure 42 may be selected based on an actual situation. This is not strictly limited.

In the assembly solution 3 of the second soldering structure 40, content that is the same as that in the assembly solution 1 is not described again. A difference from the assembly solution 1 is that the second solder structure 42 further includes the solder paste having the 50% alloy. That is, the second solder structure 42 not only includes the prefabricated tin having the 100% alloy, but also includes the solder paste having the 50% alloy. For an implementation form of the second solder structure 42 in the assembly solution 3, refer to the foregoing assembly solution 1 and assembly solution 2.

With reference to the assembly possibility of forming the first soldering structure 30 in the first gap region A and the assembly possibility of forming the second soldering structure 40 in the second gap region B, it should be understood that, in a presentation form of the connection assembly 70, a possibility of arranging the first soldering structure 30 in the first gap region A and a possibility of arranging the second soldering structure 40 in the second gap region B may be randomly arranged and combined. In addition, accurate tin amount matching and arrangement of the support member 50 are performed based on deformed gap distribution, so that problems of solder bridging and open soldering caused by deformation of the upper-layer substrate 10 and the lower-layer substrate 20 can be resolved to the maximum extent.

For example, the assembly solution 1 of the first soldering structure 30 and the assembly solution 1 of the second soldering structure 40 may be combined. Alternatively, the assembly solution 1 of the first soldering structure 30 and the assembly solution 2 of the second soldering structure 40 may be combined. It should be understood that this is not limited thereto, and other possibilities are not enumerated herein.

In a second embodiment of this application, different from the first embodiment, the support member 50 may participate in forming of a solder joint and form the solder joint together with a soldering material. In other words, the support member 50 may directly form a structure that can support the upper-layer substrate 10 and the lower-layer substrate 20 and implement electrical interconnection between the upper-layer substrate 10 and the lower-layer substrate 20.

Specifically, the support member 50 in the first gap region A and/or the support member 50 in the second gap region B includes a core structure and a soldering material layer wrapping around a periphery of the core structure, and a melting point of the core structure is higher than a melting point of the soldering material layer. For example, the core structure may be a spherical core, and the melting point of the core structure is higher than the melting point of the soldering material layer, so that the core structure can be used as a support structure to play a support role. In this structure, a minimum support height between the upper-layer substrate 10 and the lower-layer substrate 20 can be ensured.

Figure 27:
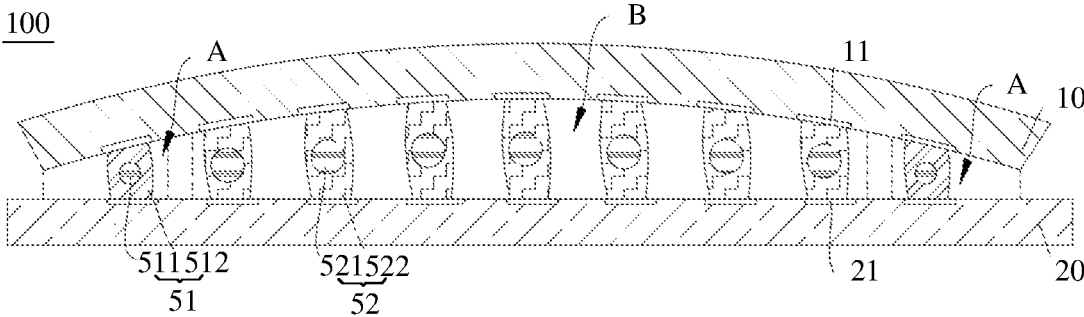
FIG. 27 is an example schematic diagram of a plurality of support members of a board-level structure according to a second embodiment of this application.
Figure 28:
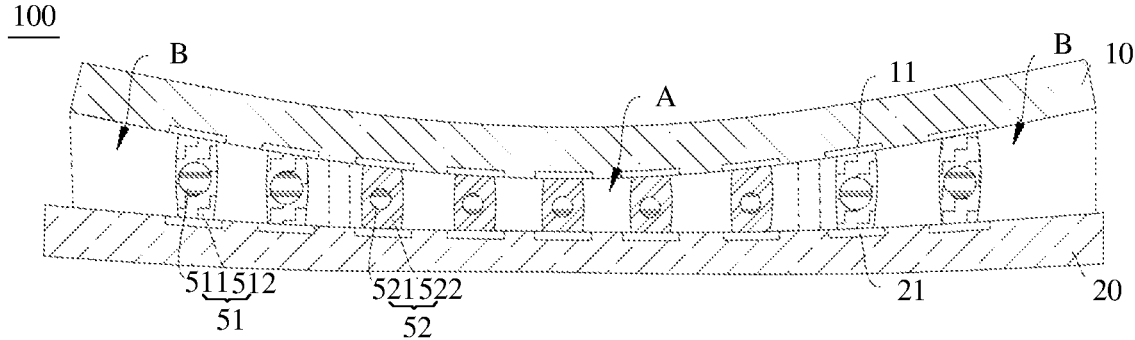
FIG. 28 is another example schematic diagram of a structure of a plurality of support members of a board-level structure according to a second embodiment of this application.

Refer to FIG. 27 and FIG. 28. In a possible implementation, each support member 50 distributed in the first gap region A and the second gap region B includes a core structure and a soldering material layer wrapping around a periphery of the core structure.

Each support member 50 may be understood as the first soldering structure 30 or the second soldering structure 40 in the first embodiment. That is, the support member 50 located in the first gap region A may be understood as the first soldering structure 30, and the support member 50 located in the second gap region B may be understood as the second soldering structure 40.

For example, the support member 50 located in the first gap region A is a first support member 51, and the support member 50 located in the second gap region B is a second support member 52. Each first support member 51 includes a core structure 511 and a soldering material layer 512 wrapping around a periphery of the core structure, and each second support member 52 also includes a core structure 521 and a soldering material layer 522 wrapping around a periphery of the core structure. For example, the core structure 511 of the first support member 51 and the core structure 521 of the second support member 52 may have a same size or different sizes. A thickness of the core structure 511 of the first support member 51 may be different from a thickness of the core structure 521 of the second support member 52.

Figure 29:
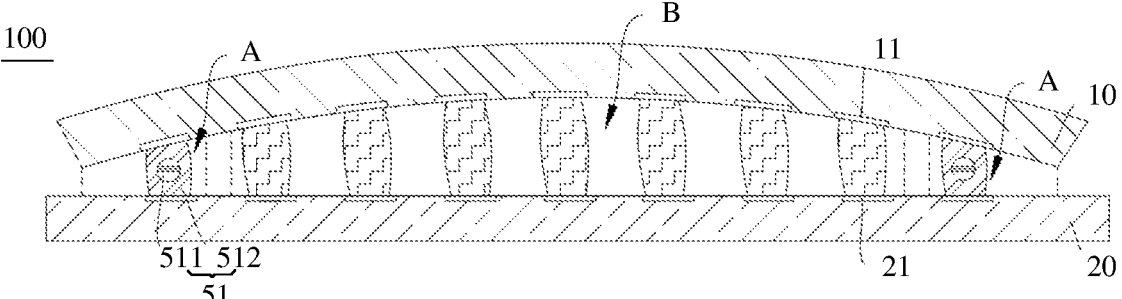
FIG. 29 is still another example schematic diagram of a structure of a plurality of support members of a board-level structure according to a second embodiment of this application.
Figure 30:
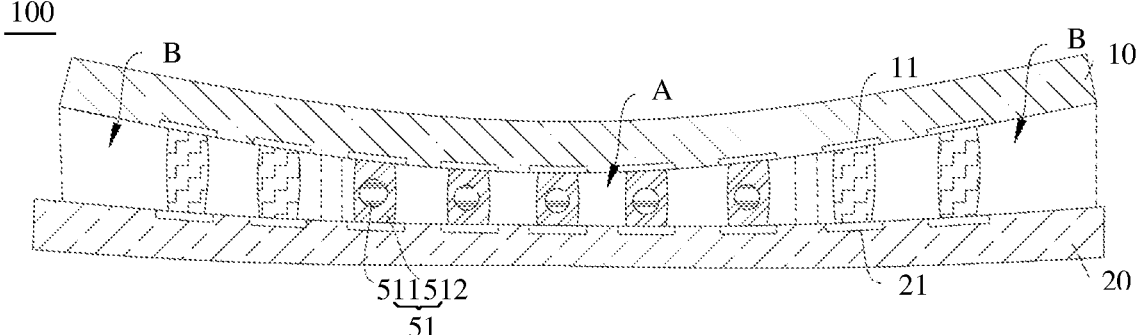
FIG. 30 is yet another example schematic diagram of a structure of a plurality of support members of a board-level structure according to a second embodiment of this application.

Refer to FIG. 29 and FIG. 30. In another possible implementation, different from the first implementation, the first support member 51 distributed in only the first gap region A includes the core structure 511 and the soldering material layer 512 wrapping around the periphery of the core structure 511. For example, sizes of the core structures 511 may be the same or different.

Figure 31:
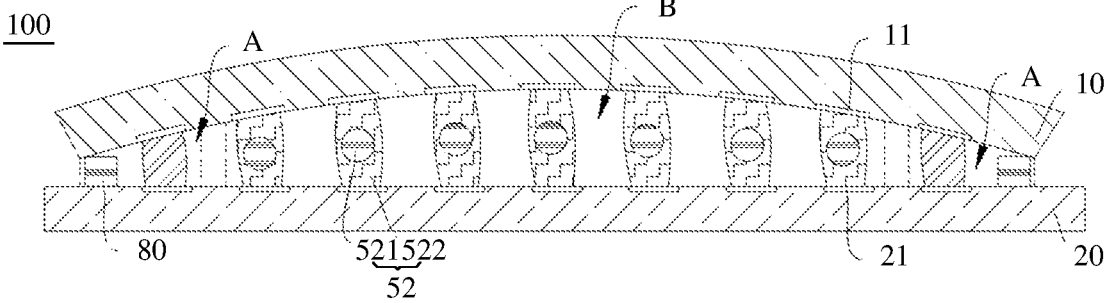
FIG. 31 is a fifth example schematic diagram of a structure of a plurality of support members of a board-level structure according to a second embodiment of this application.
Figure 32:
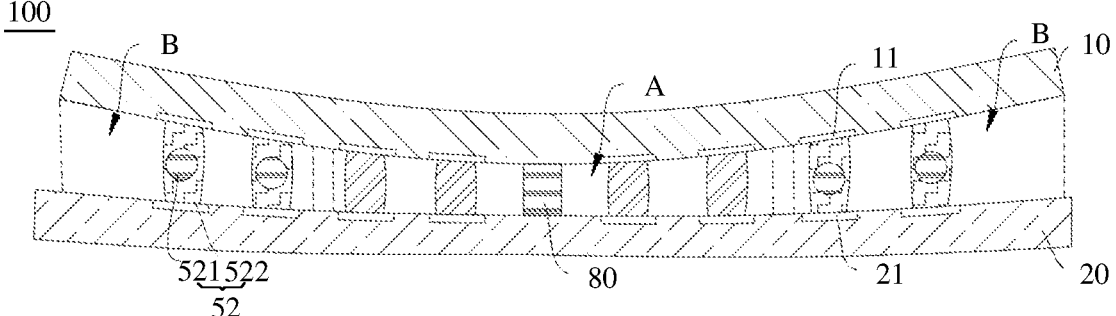
FIG. 32 is a sixth example schematic diagram of a structure of a plurality of support members of a board-level structure according to a second embodiment of this application.

Refer to FIG. 31 and FIG. 32. In still another possible implementation, the second support member 52 distributed in only the second gap region B includes the core structure 521 and the soldering material layer 522 wrapping around the periphery of the core structure 521. For example, sizes of the core structures may be the same or different. In addition, in this implementation, the board-level structure 100 may further include a support body 80 disposed in the first gap region A. The support body 80 is supported between the upper-layer substrate 10 and the lower-layer substrate 20, to ensure a minimum support distance between the upper-layer substrate 10 and the lower-layer substrate 20. It should be understood that there may be a plurality of support bodies 80. When there are the plurality of support bodies 80, sizes of the support bodies 80 may be the same or may be different. This is not strictly limited.

Embodiments of this application are described above in detail. Although the principles and implementations of this application are described by using specific examples in this specification, the descriptions of the foregoing embodiments are merely intended to help understand the method and the core idea of the method of this application. In addition, a person of ordinary skill in the art may make modifications to the specific implementations and application range according to the idea of this application. In conclusion, the content of this specification is not construed as a limit on this application.

What is claimed is:

1. A board-level structure, comprising:
an upper-layer substrate;
a lower-layer substrate; and
a plurality of support members supportable between the upper-layer substrate and the lower-layer substrate, wherein
the upper-layer substrate and the lower-layer substrate include a gap between the upper-layer substrate and the lower-layer substrate,
the gap includes one or more first gap regions and one or more second gap regions in a plane on which an orthographic projection of the upper-layer substrate is located,
a first gap region, from the one or more first gap regions, and a second gap region, from the one or more second gap regions, are spaced,
a spaced region between the first gap region and the second gap region does not comprise the first gap region or the second gap region,
a first vertical distance between the upper-layer substrate and the lower-layer substrate in the first gap region is less than or equal to a second vertical distance between the upper-layer substrate and the lower-layer substrate in the second gap region,
a maximum vertical distance between the upper-layer substrate and the lower-layer substrate in the first gap region is less than a minimum vertical distance between the upper-layer substrate and the lower-layer substrate in the second gap region,
a difference between the minimum vertical distance and the maximum vertical distance is greater than or equal to 100 micrometers, and
the plurality of support members are distributed at intervals in the first gap region and/or the second gap region.

2. The board-level structure according to claim 1, wherein when a quantity of first gap regions, from the one or more first gap regions, is greater than or equal to 2, one second gap region, from the one or more second gap regions, exists between every two adjacent first gap regions.

3. The board-level structure according to claim 1, wherein the plurality of support members are distributed at intervals in both the first gap region and the second gap region, and in the first gap region, the plurality of support members are supported between the upper-layer substrate and the lower-layer substrate; and
in the second gap region, a first end of two ends of a support member abuts against one of the upper-layer substrate and the lower-layer substrate, and a second end of the two ends of the support member is isolated from another of the upper-layer substrate and the lower-layer substrate, or
in the second gap region, first and second ends of the support member respectively abut against the upper-layer substrate and the lower-layer substrate.

4. The board-level structure according to claim 1, wherein the plurality of support members are distributed at intervals in the first gap region, and the plurality of support members are supported between the upper-layer substrate and the lower-layer substrate; and
heights of the plurality of support members are the same or different, and the support member includes a height direction perpendicular to a plane on which a surface of the lower-layer substrate is located.

5. The board-level structure according to claim 1, wherein a cross-sectional shape of a support member in a height direction of the support member includes one or more of a U shape, a rectangle, and an arc, and
the height direction of the support member is perpendicular to a plane on which a surface of the lower-layer substrate is located.

6. The board-level structure according to claim 1, wherein a type of a support member includes an electronic element or a gasket, and a material of the gasket includes metal, plastic, or ceramic.

7. The board-level structure according to claim 1, further comprising:
a plurality of first soldering structures; and
a plurality of second soldering structures, where
each of the plurality of first soldering structures and each of the plurality of second soldering structures are located between the upper-layer substrate and the lower-layer substrate, and each of the plurality of first soldering structures and each of the plurality of second soldering structures conduct the upper-layer substrate and the lower-layer substrate, and
the plurality of first soldering structures are arranged at intervals in the first gap region, and the plurality of second soldering structures are arranged at intervals in the second gap region.

8. The board-level structure according to claim 1, wherein the plurality of support members are distributed at intervals in the first gap region and the second gap region, and each of the plurality of support members is located between the upper-layer substrate and the lower-layer substrate, and each of the plurality of support members conducts the upper-layer substrate and the lower-layer substrate, and
a support member in the first gap region and/or a support member in the second gap region includes a core structure and a soldering material layer wrapping around a periphery of the core structure, and a melting point of the core structure is higher than a melting point of the soldering material layer.

9. The board-level structure according to claim 3, wherein the support member in the first gap region includes a height unequal to a height of the support member in the second gap region, and the support member includes a height direction perpendicular to a plane on which a surface of the lower-layer substrate is located; or
the support member in the first gap region includes a height equal to a height of the support member in the second gap region, and the support member includes a height direction perpendicular to a plane on which a surface of the lower-layer substrate is located.

10. The board-level structure according to claim 7, wherein
a first soldering structure, from the plurality of first soldering structures, includes a first solder ball disposed on the upper-layer substrate, and
the first solder ball includes a solder ball body and a solder flux layer, and the solder flux layer covers at least a part of an outer surface of the solder ball body.

11. The board-level structure according to claim 7, wherein a first soldering structure, from the plurality of first soldering structures, includes a first solder ball and a first solder structure, the first solder ball is disposed on the upper-layer substrate, the first solder structure is disposed on the lower-layer substrate, and a material of the first solder structure includes a paste flux or a solder paste having 50% alloy.

12. The board-level structure according to claim 7, wherein a second soldering structure, from the plurality of second soldering structures, includes a second solder ball and a second solder structure, the second solder ball is disposed on the upper-layer substrate, the second solder structure is disposed on the lower-layer substrate, and a material of the second solder structure includes prefabricated tin having 100% alloy and/or a solder paste having 50% alloy.

13. The board-level structure according to claim 7, wherein each of the plurality of support members have both a high melting point and a support function, and each of the plurality of support members are not melted in a soldering process.

14. The board-level structure according to claim 10, wherein the solder ball body is made of soldering tin, or the solder ball body includes a core layer and a tin layer wrapping an outer surface of the core layer, wherein at least a part of the tin layer is connected to the solder flux layer, a melting point of the core layer is higher than a melting point of the tin layer, and the c er includes a spherical support structure.

15. The board-level structure according to claim 12, wherein when the material of the second solder structure includes the solder paste having the 50% alloy, a tin amount of the second solder structure is greater than a tin amount of the first solder structure.

16. The board-level structure according to claim 12, wherein heights of the second solder structures are the same or different, and a height direction of the second solder structure is perpendicular to a plane on which a surface of the lower-layer substrate is located.

17. The board-level structure according to claim 12, wherein a surface of each second solder ball in contact with a corresponding second solder structure is an arc surface, and surfaces of at least some second solder structures in contact with corresponding second solder balls are planes; or outer surfaces of all second solder structures are arc surfaces, and surfaces of at least some second solder balls in contact with corresponding second solder structure are planes, wherein all of the plurality of second solder structures are prefabricated solder balls made of the prefabricated tin, all of the plurality of second solder structures are prefabricated solder sheets made of the prefabricated tin, or some of the second solder structures are prefabricated solder balls made of the prefabricated tin, and others of the second solder structures are prefabricated solder sheets made of the prefabricated tin.

18. The board-level structure according to claim 12, wherein surfaces of all second solder balls in contact with corresponding second solder structures are arc surfaces, and surfaces of all second solder structures in contact with corresponding second solder balls are also arc surfaces, wherein the board-level structure further comprises a limiting apparatus configured to limit relative sliding between the prefabricated solder ball and the second solder ball, or the board-level structure further comprises a collapsible structural member located in the second gap region and supported between the upper-layer substrate and the lower-layer substrate.

19. A communication device, comprising:

a mounting frame; and a board-level structure, wherein the board-level structure comprises:

an upper-layer substrate;

a lower-layer substrate; and a plurality of support members supportable between the upper-layer substrate and the lower-layer substrate, wherein the upper-layer substrate and the lower-layer substrate include a gap between the upper-layer substrate and the lower-layer substrate, the gap includes one or more first gap regions and one or more second gap regions in a plane on which an orthographic projection of the upper-layer substrate is located, a first gap region, from the one or more first gap regions, and a second gap region, from the one or more second gap regions, are spaced, a spaced region between the first gap region and the second gap region does not comprise the first gap region or the second gap region, a first vertical distance between the upper-layer substrate and the lower-layer substrate in the first gap region is less than or equal to a second vertical distance between the upper-layer substrate and the lower-layer substrate in the second gap region, a maximum vertical distance between the upper-layer substrate and the lower-layer substrate in the first gap region is less than a minimum vertical distance between the upper-layer substrate and the lower-layer substrate in the second gap region, a difference between the minimum vertical distance and the maximum vertical distance is greater than or equal to 100 micrometers, and the plurality of support members are distributed at intervals in the first gap region and/or the second gap region, and the board-level structure is mounted on the mounting frame.

20. The communication device according to claim 19, wherein the board-level structure further comprises:

a plurality of first soldering structures; and a plurality of second soldering structures, wherein each of the plurality of first soldering structures and each of the plurality of second soldering structures are located between the upper-layer substrate and the lower-layer substrate, and each of the plurality of first soldering structures and each of the plurality of second soldering structures conduct the upper-layer substrate and the lower-layer substrate, the plurality of first soldering structures are arranged at intervals in the first gap region, and the plurality of second soldering structures are arranged at intervals in the second gap region, a second soldering structure, from the plurality of second soldering structures, includes a second solder ball and a second solder structure, the second solder ball is disposed on the upper-layer substrate, the second solder structure is disposed on the lower-layer substrate, a material of the second solder structure includes prefabricated tin having 100% alloy and/or a solder paste having 50% alloy, and surfaces of all second solder balls in contact with corresponding second solder structures are arc surfaces, and surfaces of all second solder structures in contact with corresponding second solder balls are also arc surfaces, wherein the board-level structure further comprises a limiting apparatus configured to limit relative sliding between the prefabricated solder ball and the second solder ball, or the board-level structure further comprises a collapsible structural member located in the second gap region and supported between the upper-layer substrate and the lower-layer substrate.

* * * * *